(12) United States Patent
Takayama et al.

(10) Patent No.: US 10,121,982 B2
(45) Date of Patent: Nov. 6, 2018

(54) SOLAR CELL, SOLAR CELL MODULE, AND METHOD FOR MANUFACTURING SOLAR CELL

(71) Applicant: Kabushiki Kaisha Toshiba, Minato-ku (JP)

(72) Inventors: Satoshi Takayama, Kawasaki (JP); Haruhi Oooka, Kawasaki (JP); Hideyuki Nakao, Setagaya (JP); Akihiko Ono, Kita (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 24 days.

(21) Appl. No.: 14/981,186

(22) Filed: Dec. 28, 2015

(65) Prior Publication Data
US 2016/0118609 A1  Apr. 28, 2016

Related U.S. Application Data

(63) Continuation of application No. PCT/JP2014/066740, filed on Jun. 24, 2014.

(30) Foreign Application Priority Data

Jul. 1, 2013 (JP) .................................. 2013-138234

(51) Int. Cl.
*H01L 51/44* (2006.01)
*H01L 51/00* (2006.01)
*H01L 51/42* (2006.01)

(52) U.S. Cl.
CPC ........ *H01L 51/447* (2013.01); *H01L 51/0031* (2013.01); *H01L 51/445* (2013.01);
(Continued)

(58) Field of Classification Search
CPC .. H01L 51/0031; H01L 51/447; H01L 51/445
See application file for complete search history.

(56) References Cited

U.S. PATENT DOCUMENTS

| 4,464,823 A | 8/1984 | Izu et al. |
| 6,132,585 A | 10/2000 | Midorikawa et al. |

(Continued)

FOREIGN PATENT DOCUMENTS

| CN | 1443029 A | 9/2003 |
| JP | 5-3333 A | 1/1993 |

(Continued)

OTHER PUBLICATIONS

Chen et al., "Surface plasmonenhancementofpolymer solar cellsbypenetratingAu/SiO2 core/shell nanoparticles intoallorganiclayers", Nano Energy(2013) 2, 906-915.*

(Continued)

*Primary Examiner* — Tae-Sik Kang
(74) *Attorney, Agent, or Firm* — Oblon, McClelland, Maier & Neustadt, L.L.P.

(57) ABSTRACT

A solar cell includes a substrate and a stacked body. The substrate includes an upper surface. The stacked body includes a lower electrode, a photoelectric conversion film, and an upper electrode. The lower electrode is provided on the upper surface. The photoelectric conversion film is provided on the lower electrode. The upper electrode is provided on the photoelectric conversion film. The stacked body includes a first region and a second region. The first region includes a foreign matter between the lower electrode and the photoelectric conversion film. The second region is without the foreign matter. A distance between an end of the foreign matter in a first direction parallel with the upper surface and the upper electrode in a second direction intersecting the upper surface is greater than a distance in the (Continued)

second direction between the lower electrode and the upper electrode in the second region.

16 Claims, 14 Drawing Sheets

(52) U.S. Cl.
CPC ......... *H01L 51/4273* (2013.01); *Y02E 10/549* (2013.01); *Y02P 70/521* (2015.11)

(56) References Cited

U.S. PATENT DOCUMENTS

| | | | | |
|---|---|---|---|---|
| 6,133,522 | A | * | 10/2000 | Kataoka ............ B32B 17/10788 136/251 |
| 8,216,872 | B1 | * | 7/2012 | Shieh .................... G02B 5/0242 438/69 |
| 2003/0168974 | A1 | | 9/2003 | Matsuki et al. |
| 2006/0247132 | A1 | | 11/2006 | Newsome et al. |
| 2012/0055536 | A1 | | 3/2012 | Saito et al. |
| 2012/0126356 | A1 | | 5/2012 | Iwabuchi et al. |

FOREIGN PATENT DOCUMENTS

| | | |
|---|---|---|
| JP | 5-66752 A | 3/1993 |
| JP | 6-21493 A | 1/1994 |
| JP | 6-140648 | 5/1994 |
| JP | 11-54286 | 2/1999 |
| JP | 11-54286 A | 2/1999 |
| JP | 2001-156306 A | 6/2001 |
| JP | 2002-261308 A | 9/2002 |
| JP | 2003-257675 | 9/2003 |
| JP | 2005-93939 A | 4/2005 |
| JP | 2006-332636 A | 12/2006 |
| JP | 2007-35348 | 2/2007 |
| JP | 2007-35348 A | 2/2007 |
| JP | 2007-522656 | 8/2007 |
| JP | 2007-522656 A | 8/2007 |
| JP | 2007-324259 | 12/2007 |
| JP | 2007-324259 A | 12/2007 |
| JP | 2009-544163 A | 12/2009 |
| JP | 2010-103170 A | 5/2010 |
| JP | 2010-171046 A | 8/2010 |
| JP | 2011-187852 A | 9/2011 |
| JP | 2011-192544 | 9/2011 |
| JP | 2011-243970 | 12/2011 |
| JP | 2012-99328 A | 5/2012 |
| JP | 2013-16342 | 1/2013 |
| JP | 2013-16342 A | 1/2013 |
| WO | WO 2005/086255 A1 | 9/2005 |
| WO | WO 2008/010165 A2 | 1/2008 |
| WO | WO 2010/119558 A1 | 10/2010 |
| WO | WO 2011/115096 A1 | 9/2011 |
| WO | WO 2014/046539 A | 3/2014 |

OTHER PUBLICATIONS

Steim et al, "Flexible polymer photovoltaic modules with incorporated organic bypass diodes to address module shading effects", Solar Energy Materials & Solar Cells 93 (2009) 1963-1967.*
Sha et al., "Optical design of organic solar cell with hybrid plasmonic system", Optics Express, Aug. 15, 2011 / vol. 19, No. 17, pp. 15908-15918.*
Office Action dated May 24, 2016 in Japanese Patent Application No. 2013-138234 (with English translation).
International Search Report dated Aug. 12, 2014 in PCT/JP2014/066740 filed Jun. 24, 2014 (with English translation).
Written Opinion dated Aug. 12, 2014 in PCT/JP2014/066740 filed Jun. 24, 2014.
Masahiro Hosoya, et al., "Efficiency Enhancement by Sloped Cell Architecture in Organic Photovoltaics" Renewable Energy 2010 Proceedings, O-Pv-9-1, 2010, 4 Pages.

* cited by examiner

SOLAR CELL, SOLAR CELL MODULE, AND METHOD FOR MANUFACTURING SOLAR CELL

CROSS-REFERENCE TO RELATED APPLICATIONS

This is a continuation application of International Application PCT/JP2014/066740, filed on Jun. 24, 2014; the entire contents of which are incorporated herein by reference.

FIELD

Embodiments described herein relate generally to a solar cell, a solar cell module, and a method for manufacturing solar cell.

BACKGROUND

There exist solar cells using organic semiconductors containing a combination of conductive polymers, fullerenes, or the like. There exist solar cell modules that contain a plurality of solar cells. In a solar cell using an organic semiconductor, a photoelectric conversion film can be formed using a simple method such as a coating method or a printing method. There is a demand for improved photoelectric conversion efficiency in solar cells using organic semiconductors.

DETAILED DESCRIPTION

Figure 1:
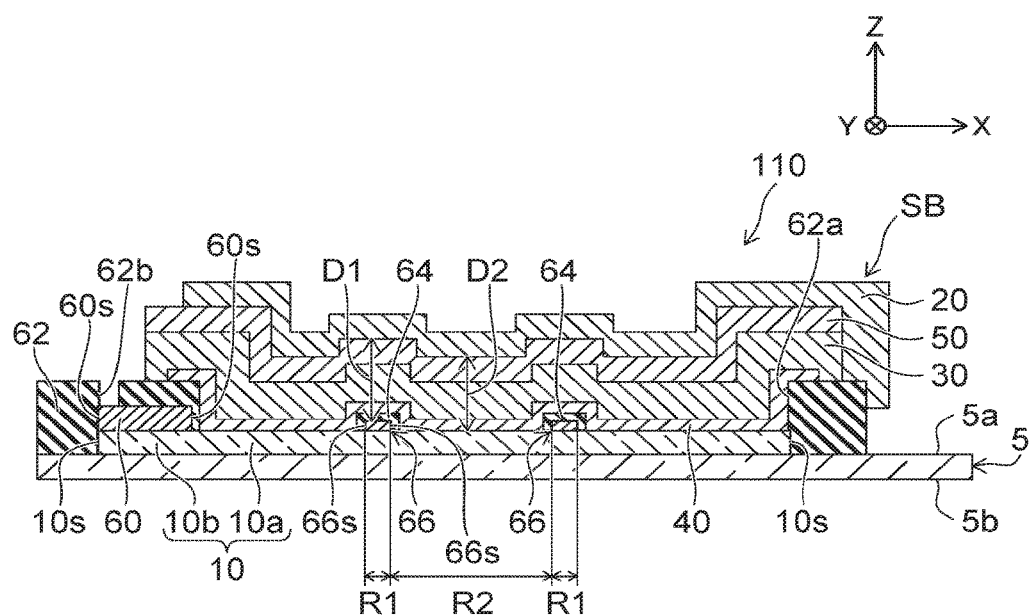
FIG. 1 is a schematic cross-sectional view illustrating a solar cell according to a first embodiment.

According to one embodiment, a solar cell includes a substrate and a stacked body. The substrate includes an upper surface. The stacked body includes a lower electrode, a photoelectric conversion film, and an upper electrode. The lower electrode is provided on the upper surface. The photoelectric conversion film is provided on the lower electrode and includes an organic semiconductor. The upper electrode is provided on the photoelectric conversion film. The stacked body includes a first region and a second region. The first region includes a foreign matter between the lower electrode and the photoelectric conversion film. The second region is without the foreign matter between the lower electrode and the photoelectric conversion film. A distance between an end of the foreign matter in a first direction parallel with the upper surface and the upper electrode in a second direction intersecting the upper surface is greater than a distance in the second direction between the lower electrode and the upper electrode in the second region.

According to another embodiment, a solar cell module includes a substrate and a plurality of solar cells. The substrate includes an upper surface. The solar cells is provided on the upper surface. One of the solar cells includes a first stacked body. The first stacked body includes a first lower electrode, a first photoelectric conversion film, and a first upper electrode. The first lower electrode is provided on the upper surface. The first photoelectric conversion film is provided on the first lower electrode and includes an organic semiconductor. The first upper electrode is provided on the first photoelectric conversion film. One other of the solar cells adjacent to the one of the solar cells includes a second stacked body. The second stacked body includes a second lower electrode, a second photoelectric conversion film, and a second upper electrode. The second lower electrode is provided on the upper surface. The second photoelectric conversion film is provided on the second lower electrode and includes an organic semiconductor. The second upper electrode is provided on the second photoelectric conversion film. the first stacked body includes a first region and a second region. The first region includes a foreign matter between the first lower electrode and the first photoelectric conversion film. The second region is without the foreign matter between the first lower electrode and the first photoelectric conversion film. A distance between an end of the foreign matter in a first direction parallel with the upper surface and the first upper electrode in a second direction intersecting the upper surface is greater than a distance in the second direction between the first lower electrode and the first upper electrode in the second region.

According to another embodiment, a method is disclosed for manufacturing a solar cell. The method can include forming a stacked body on a substrate including an upper surface. The forming the stacked body includes forming a lower electrode on the upper surface, forming a photoelectric conversion film including an organic semiconductor on the lower electrode, and forming an upper electrode on the photoelectric conversion film. The forming the stacked body further includes detecting a foreign matter on the lower electrode using an optical sensor, and dispensing repair fluid using a drop dispenser unit onto an end of the foreign matter in a first direction parallel to the upper surface.

Various embodiments will be described hereinafter with reference to the accompanying drawings.

The drawings are schematic or conceptual. The relationship between the thickness and the width of each portion, and the size ratio between the portions, for instance, are not necessarily identical to those in reality. Furthermore, the same portion may be shown with different dimensions or ratios depending on the figures.

In the present specification and the drawings, components similar to those described previously with reference to earlier figures are labeled with like reference numerals, and the detailed description thereof is omitted appropriately.

First Embodiment

FIG. 1 is a schematic cross-sectional view illustrating a solar cell according to a first embodiment.

As illustrated in FIG. 1, a solar cell 110 includes a substrate 5 and a stacked body SB. The substrate 5 includes an upper surface 5a and a lower surface 5b. The lower surface 5b is on the opposite face from the upper surface 5a. In this example, the lower surface 5b is substantially parallel to the upper surface 5a. The lower surface 5b may also be non-parallel to the upper surface 5a.

The stacked body SB includes a lower electrode 10, an upper electrode 20, and a photoelectric conversion film 30. The lower electrode 10 is provided on the upper surface 5a. The photoelectric conversion film 30 is provided above the lower electrode 10. The upper electrode 20 is provided above the photoelectric conversion film 30.

In this example, the stacked body SB further includes a lower intermediate layer 40 and an upper intermediate layer 50. The lower intermediate layer 40 is provided between the lower electrode 10 and the photoelectric conversion film 30. The upper intermediate layer 50 is provided between the photoelectric conversion film 30 and the upper electrode 20. In other words, in this example, the lower intermediate layer 40 is provided on the lower electrode 10, the photoelectric conversion film 30 is provided on the lower intermediate layer 40, the upper intermediate layer 50 is provided on the photoelectric conversion film 30, and the upper electrode 20 is provided on the upper intermediate layer 50.

The solar cell 110 is a photoelectric converter device for generating an electric charge commensurate with the amount of incident light between the lower electrode 10 and the upper electrode 20. The photoelectric conversion film 30 includes an organic semiconductor. The solar cell 110 is, for example, an organic photovoltaic. The light contributing to the power generation performed by the solar cell 110 is not limited to sunlight. The solar cell 110 may also generate power using, for example, light emitted by a light source such as a lightbulb.

In this example, the substrate 5 and the lower electrode 10 have optical transparency. The substrate 5 and the lower electrode 10 are, for example, transparent. The lower electrode 10 is, for example, a transparent electrode. In this example, light incident upon the lower surface 5b passes through the substrate 5 and the lower electrode 10 and strikes the photoelectric conversion film 30. The light may also be incident upon the photoelectric conversion film 30 from the side of the upper electrode 20. In such cases, the upper electrode 20 is a transparent electrode. As used herein, the term "optical transparency" refers to the property of passing at least 70% of light of various wavelengths that are capable of generating excitons by being absorbed by the photoelectric conversion film 30.

Here, one direction parallel to the upper surface 5a is defined as the X-axis direction. A direction parallel to the upper surface 5a and perpendicular to the X-axis direction is defined as the Y-axis direction. A direction perpendicular to the X-axis direction and the Y-axis direction is defined as the Z-axis direction. In other words, the Z-axis direction is a direction perpendicular to the upper surface 5a.

The substrate 5, lower electrode 10, lower intermediate layer 40, photoelectric conversion film 30, upper intermediate layer 50, and upper electrode 20 extend, for example, in the Y-axis direction. The solar cell 110 is, for example, rectangular in shape when projected onto a plane (the X-Y plane) that is parallel to the upper surface 5a (i.e., when viewed from the Z-axis direction). The shape of the solar cell 110 as projected onto the X-Y plane is not limited to being rectangular, and may be any shape.

The substrate 5 supports the other configuration members. A material that, for example, exhibits substantially no denaturation from heat, organic solvent, or the like used to form the lower electrode 10 and the like is used for the substrate 5. For example, an inorganic materials such as alkali-free glass or quartz glass is used as the material of the substrate 5. The material of the substrate 5 may be, for example, polyethylene, polyethylene terephthalate (PET), polyethylene naphthalate (PEN), a polyimide, a polyamide, a polyamide-imide, a liquid crystal polymer, a resin material such as a cycloolefin polymer, or a polymer film. A material having optical transparency is used for the substrate 5. If light is incident from the upper electrode 20 side, a material having no optical transparency may be used for the substrate 5. In such cases, the material of the substrate 5 may be a metal substrate such as stainless steel (SUS), or silicon. There is no particular limitation upon the thickness (length along the Z-axis direction) of the substrate 5. The thickness of the substrate 5 may be any thickness that is capable of imparting the substrate 5 with the strength necessary to support the other configuration members.

An anti-reflective layer for suppressing reflection of incident light may be provided, for example, upon the lower surface 5b or between the substrate 5 and the lower electrode 10. The anti-reflective layer may be, for example, an anti-reflective coating, an anti-reflective film, or an anti-reflective sheet. An inorganic material such as, for example, titanium oxide may be used as the material of the anti-reflective layer. The material of the anti-reflective layer may also be an organic material such as, for example, an acrylic resin or a polycarbonate resin.

In this example, the lower electrode 10 is, for example, an anode. A material having optical transparency and conductivity is used for the lower electrode 10. For example, a conductive metal oxide film or a semi-transparent thin metal film is used for the lower electrode 10. Examples of metal oxide films include films (NESAs, etc.) manufactured using conductive glass made, for example, of indium tin oxide (ITO), fluorine doped tin oxide (FTO), or indium zinc oxide. ITO is a compound including indium oxide, zinc oxide, and tin oxide. Examples of materials for thin metal films include gold, platinum, silver, and copper. ITO or FTO is especially preferable as the material of the lower electrode 10. Polyaniline, which is the organic conductive polymer, or a derivative thereof, or a polythiophene or derivative thereof, may be used as the material of the lower electrode 10.

If ITO is used for the lower electrode 10, the thickness of the lower electrode 10 is preferably from 30 to 300 nm. If the thickness is less than 30 nm, conductivity will decrease and resistance will increase, which can cause reductions in photoelectric conversion efficiency. If the thickness is greater than 300 nm, the flexibility of the ITO will be reduced, promoting the formation of cracks under stress. The sheet resistance of the lower electrode 10 is preferably as low as possible. The sheet resistance of the lower electrode 10 is preferably, for example, 10 Ω/square or less.

The lower electrode 10 may be formed, for example, by forming a film of the materials listed above using a vacuum deposition method, a sputtering method, an ion plating method, a plating method, a coating method, or the like. The lower electrode 10 may be a single layer or a stacked body in which multiple layers made of materials having different work functions are stacked. If light is incident from the upper electrode 20 side, the material of the lower electrode 10 needs not have optical transparency. In other words, there is no particular limitation upon the material of the lower electrode 10 as long as the lower electrode 10 has conductivity.

The lower intermediate layer 40 is, for example, a first charge transport layer. In this example, the lower intermediate layer 40 is a hole transport layer. For example, the lower intermediate layer 40 efficiently transports holes and blocks electrons. The lower intermediate layer 40 suppresses, for example, the annihilation of excitons generated near the interface with the photoelectric conversion film 30. The lower intermediate layer 40 also, for example, levels (planarization) unevenness in the lower electrode 10 and prevents short circuits of the solar cell 110.

For example, a polythiophene polymer or an organic conductive polymer such as polyaniline or polypyrrole is used for the lower intermediate layer 40. An example of a usable polythiophene polymer is PEDOT/PSS (poly(3,4-ethylenedioxythiophene)-poly(styrene sulfonate)). Representative examples of polythiophene polymer products include Clevios™ PH500, Clevios™ PH, Clevios™ PV P Al 4083, and Clevios™ HIL 1.1, all produced by H.C. Starck GmbH. A preferred nonorganic material is molybdenum oxide.

If Clevios™ 500 is used as the material of the lower intermediate layer 40, the thickness of the lower intermediate layer 40 is preferably, for example, from 20 to 100 nm. If the layer is too thin, the action thereof in preventing short circuits in the lower electrode 10 will be reduced, increasing the likelihood of short circuits occurring. If the layer is too thick, the resistance of the film will increase, limiting the amount of current generated by the photoelectric conversion film 30 and resulting in a reduction in photoelectric conversion efficiency.

There is no particular limitation upon the method used to form the lower intermediate layer 40 as long as the method is capable of forming a thin film. The lower intermediate layer 40 may, for example, be applied as a coating using a spin coating method or the like. After applying the material of the lower intermediate layer 40 by the desired thickness, the layer is heated and dried using a hot plate or the like. Heating and drying is preferably performed, for example, at a temperature from 140 to 200° C. for anywhere from a few minutes to approximately 10 minutes. The coating solution is preferably filtered before use.

The upper intermediate layer 50 is, for example, a second charge transport layer. In this example, the upper intermediate layer 50 is an electron transport layer. For example, the upper intermediate layer 50 blocks holes and efficiently transports electrons. The upper intermediate layer 50 also, for example, suppresses the annihilation of excitons generated near the interface between the photoelectric conversion film 30 and the upper intermediate layer 50. It is also acceptable for the lower intermediate layer 40 to be an electron transport layer and the upper intermediate layer 50 to be a hole transport layer.

A metal oxide, for example, is used as the material of the upper intermediate layer 50. An example of a metal oxide is amorphous titanium oxide obtained by hydrolyzing a titanium alkoxide via a sol-gel method. There is no particular limitation upon the method used to form the upper intermediate layer 50 as long as the method is capable of forming a thin film; one example is a spin coating method. If titanium oxide is used as the material of the upper intermediate layer 50, the thickness of the upper intermediate layer 50 is preferably, for example, from 5 to 20 nm. If the thickness of the layer falls below this range, there will be a reduction in hole-blocking effects, with the result that the produced excitons will become inactive before separating into electrons and holes, impeding the efficient extraction of current. If the layer is too thick, the resistance of the film will increase, limiting the amount of current generated and reducing photoelectric conversion efficiency. The coating solution is preferably filtered before use. After applying the coating by the prescribed thickness, the layer is heated and dried using a hot plate or the like. Heating and drying is performed at a temperature of 50 to 100° C. for anywhere from a few minutes to approximately 10 minutes while promoting hydrolysis in the air. A preferred inorganic material is metallic calcium or the like.

In this example, the upper electrode 20 is, for example, a cathode. It is also acceptable for the lower electrode 10 to be a cathode and the upper electrode 20 to be an anode. The upper electrode 20 is formed from a conductive material, for example, using a vacuum depositing method, a sputtering method, an ion plating method, a plating method, or a coating method. Examples of the material of the upper electrode 20 include conductive thin metal films, metal oxide films, and the like. If the material having a high work function is used for the lower electrode 10, a material having a low work function is preferably used for the upper electrode 20. Examples of materials having low work functions include alkali metals, alkali earth metals, and the like. Specific examples include any of at least one of Li, In, Al, Ca, Mg, Sm, Tb, Yb, Zr, Na, K, Rb, Cs, and Ba, as well as alloys thereof. If light is incident upon the photoelectric conversion film 30 from the upper electrode 20 side, a material having conductive and optical transparency is used for the upper electrode 20. The upper electrode 20 may be a single layer or a stacked body in which multiple layers made of materials having different work functions are stacked. The material of the upper electrode 20 may be, for example, an alloy of one or more of the low-work-function materials and another metal material. Examples of other added metal materials include gold, silver, platinum, copper, manganese, titanium, cobalt, nickel, tungsten, tin, and the like. Examples of alloys include lithium-aluminum alloy, lithium-magnesium alloy, lithium-indium alloy, magnesium-silver alloy, magnesium-indium alloy, magnesium-aluminum alloy, indium-silver alloy, calcium-aluminum alloy, and the like.

The thickness of the upper electrode 20 is, for example, from 10 to 300 nm. If the thickness of the film falls below this range, resistance will be too great, impeding the transfer of the generated electrical charge to an external circuit. If the thickness of the film exceeds this range, an extended length of time will be necessary to form the upper electrode 20, thereby increasing the temperature of the material, which may damage the photoelectric conversion film 30 (organic layer) and reduce performance. In addition, because large amounts of material are used, the deposition apparatus is occupied for a long time, and this occupation leads to increased manufacturing costs.

Figure 2:
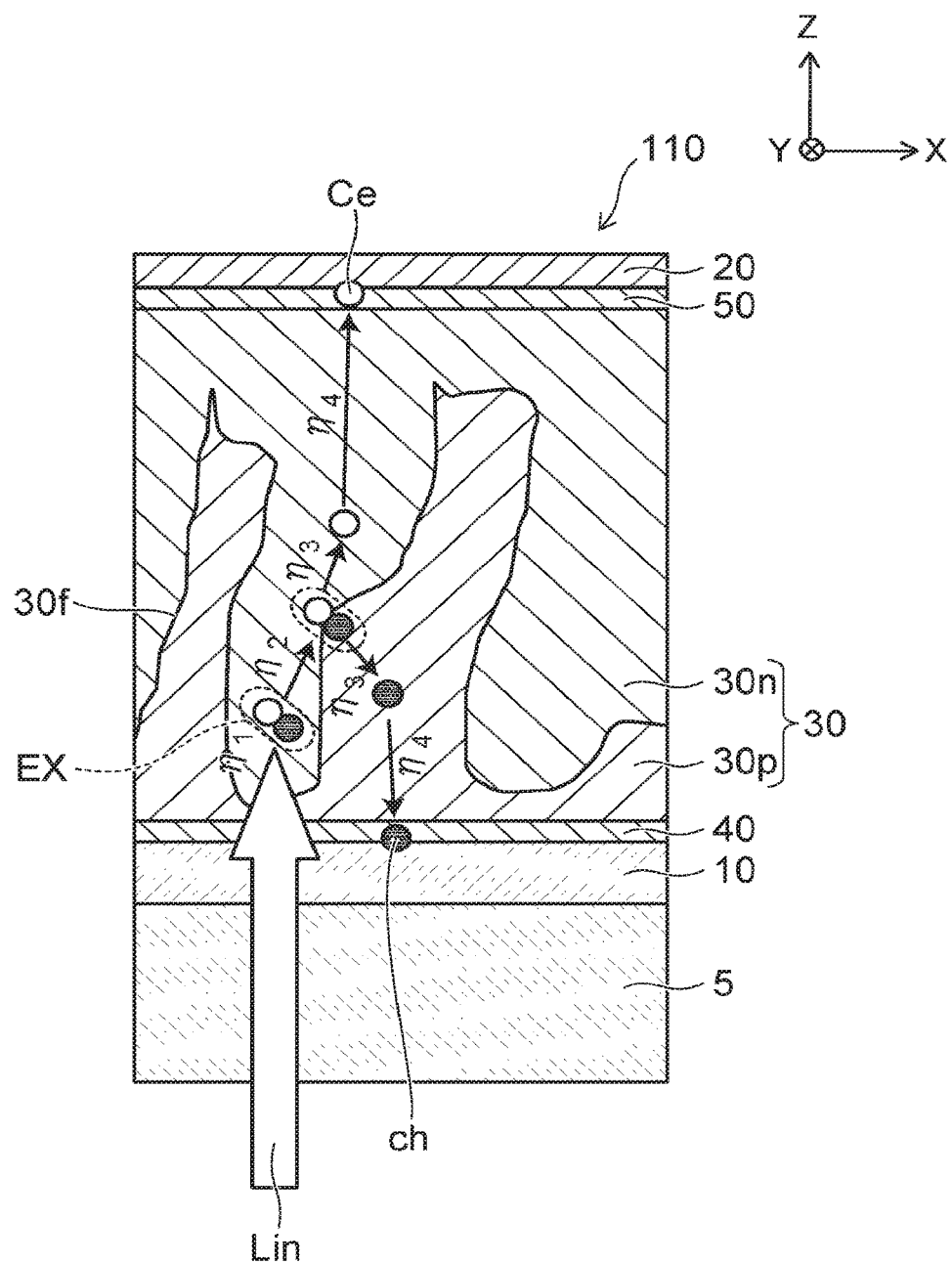
FIG. 2 is a schematic cross-sectional view illustrating a solar cell according to a first embodiment.

FIG. 2 is a schematic cross-sectional view illustrating a solar cell according to a first embodiment.

As illustrated in FIG. 2, the photoelectric conversion film 30 includes a first semiconductor layer 30n of a first conductivity type and a second semiconductor layer 30p of a second conductivity type. The second semiconductor layer 30p is provided between the lower intermediate layer 40 and the first semiconductor layer 30n. In other words, the second semiconductor layer 30p is provided on the lower intermediate layer 40, the first semiconductor layer 30n is provided on the second semiconductor layer 30p, and the upper intermediate layer 50 is provided on the first semiconductor layer 30n. For example, the first conductivity type is n-type and the second conductivity type is p-type. The first conductivity type may be p-type and the second conductivity type may be n-type. Hereinafter, an arrangement in which the first conductivity type is n-type and the second conductivity type is p-type will be described.

The photoelectric conversion film 30 is, for example, a thin film having a bulk heterojunction structure constituted by the first semiconductor layer 30n and the second semiconductor layer 30p.

A bulk heterojunction photoelectric conversion film 30 is characterized in that the first semiconductor layer 30n (n-type semiconductor) and the second semiconductor layer 30p (p-type semiconductor) are blended, and p-n junction in nano-order size is formed throughout the entire photoelectric conversion film 30. This structure is referred to, for example, as a microphase separated structure.

In a bulk heterojunction photoelectric conversion film 30, the photocharge separation that occurs as the junction faces between the mixed p-type semiconductor and n-type semiconductor is used to obtain current. In addition, the p-n junction region is broader in a bulk heterojunction photoelectric conversion film 30 than in a conventional stacked organic thin-film solar cell, and the region that actually contributes to power generation is spread throughout the entirety of the photoelectric conversion film 30. Therefore, the region that contributes to power generation in a bulk heterojunction organic thin-film solar cell is thicker than in a stacked organic thin-film solar cell. As a result, photon absorption efficiency is also improved, and the amount of current that can be obtained is increased.

For example, a material having electron-accepting properties is used for the first semiconductor layer 30n. For example, a material having electron-donating properties is used for the second semiconductor layer 30p. In the photoelectric conversion film 30 according to the embodiment, an organic semiconductor is used for at least one of the first semiconductor layer 30n and the second semiconductor layer 30p. The photoelectric conversion film 30 may also be, for example, a planar heterojunction-type film.

In the photoelectric conversion film 30, for example, the first semiconductor layer 30n or the second semiconductor layer 30p absorbs light Lin, thereby generating excitons EX. The generation efficiency is designated $\eta 1$. The generated excitons EX migrate caused by diffusion thereof through p-n junction faces 30f (the junction faces between the first semiconductor layer 30n and the second semiconductor layer 30p). The diffusion efficiency is designated $\eta 2$. Because the excitons EX have lifetime, the excitons EX can only migrate approximately the diffusion length thereof. Excitons EX reaching the p-n junction faces 30f are separated into electrons Ce and holes Ch. The separation efficiency of these excitons EX is designated $\eta 3$. The holes Ch are transported to the lower electrode 10. The electrons Ce are transported to the upper electrode 20. As a result, the electrons Ce and holes Ch (photocarriers) are carried to the exterior. The transport efficiency of these photocarriers is designated $\eta 4$.

The external extraction efficiency $\eta EQE$ of the photocarriers generated in response to irradiating photons can be expressed by the following formula. This value is equivalent to the quantum efficiency of the solar cell 110.

$$\eta EQE = \eta 1 \cdot \eta 2 \cdot \eta 3 \cdot \eta 4$$

An n-type organic semiconductor, for example, is used for the first semiconductor layer 30n. A p-type organic semiconductor, for example, is used for the second semiconductor layer 30p.

Examples of usable p-type organic semiconductors include polythiophene and derivatives thereof, polypyrrole and derivatives thereof, pyrazoline derivatives, arylamine derivatives, stilbene derivatives, triphenyldiamine derivatives, oligothiophenes and derivatives thereof, polyvinyl carbazole and derivatives thereof, polysilanes and derivatives thereof, polysiloxane derivatives including an aromatic amine on a side chain or main chain thereof, polyaniline and derivatives thereof, phthalocyanine derivatives, porphyrin and derivatives thereof, polyphenylene vinylene and derivatives thereof, and polythienylene vinylene and derivatives thereof. These materials may be used in combination. Copolymers of these materials may also be used. Examples of copolymers include thiophene-fluorine copolymers and phenylene ethylene-phenylene vinylene copolymers.

A preferred p-type organic semiconductor is polythiophenes having pi-conjugated conductive polymers and derivatives thereof. Polythiophenes and derivatives thereof are capable of ensuring superior stereoregularity, and exhibit comparatively high solubility in solvents. There is no particular limitation upon the polythiophene or derivative thereof as long as it is a compound having a thiophene skeleton. Specific examples of polythiophenes and derivatives thereof include polyalkyl thiophenes, polyaryl thiophenes, polyalkyl isothionaphthenes, and polyethylene dioxythiophenes. Examples of polyalkyl thiophenes include poly-3-methyl thiophene, poly-3-butyl thiophene, poly-3-hexyl thiophene, poly-3-octyl thiophene, poly-3-decyl thiophene, and poly-3-dodecyl thiophene. Examples of polyaryl thiophenes include poly-3-phenyl thiophene and poly-3-(p-alkylphenyl thiophene). Examples of polyalkyl isothionaphthenes include poly-3-butyl isothionaphthene, poly-3-hexyl isothionaphthene, poly-3-octyl isothionaphthene, and poly-3-decyl isothionaphthene.

In recent years, derivatives such as PCDTBT (poly[N-9''-hepta-decanyl-2,7-carbazole-alt-5,5-(4',7'-di-2-thienyl-2',1', 3'-benzothiadiazole)]), which is a copolymer made from carbazole, benzothiadiazole, and thiophene, are known as compounds that yield superior photoelectric conversion efficiency.

These conductive polymers can be formable into a film by applying a solution in which the conductive polymers are dissolved in a solvent. Consequently, these polymers offer the advantage of allowing for manufacturing large-area organic thin-film solar cells via a printing method or the like using inexpensive equipment and at low manufacturing cost.

A fullerene and a derivative thereof are preferably used as the n-type organic semiconductor. There is no particular limitation upon the fullerene derivative used as long as it is a derivative having a fullerene skeleton. Specific examples include derivatives having $C_{60}$, $C_{70}$, $C_{76}$, $C_{78}$, and $C_{84}$ as basic skeletons. The carbon atoms in the fullerene skeleton of the fullerene derivative may be modified with any functional group, and these functional groups may bond to each other to form rings. Fullerene derivatives also include fullerene-bond polymers. It is preferable that the fullerene derivative include, for example, a functional group that is highly compatible with the solvent, and be highly soluble in the solvent.

Examples of functional groups in the fullerene derivative include hydrogen atoms, hydroxyl groups, halogen atoms, alkyl groups, alkenyl groups, cyano groups, alkoxy groups, and aromatic heterocyclic groups. Examples of halogen atoms include fluorine atoms and chlorine atoms. Examples of alkyl groups include methyl groups and ethyl groups. Examples of alkenyl groups include vinyl groups. Examples of alkoxy groups include methoxy groups and ethoxy groups. Examples of aromatic heterocyclic groups include aromatic hydrocarbon groups, thienyl groups, and pyridyl groups. Examples of aromatic hydrocarbon groups include phenyl groups and naphthyl groups.

More specific examples include hydrogenated fullerenes, oxide fullerenes, and fullerene-metal complexes. Examples of hydrogenated fullerenes include $C_{60}H_{36}$, $C_{70}H_{36}$, and the like. Examples of oxide fullerenes include $C_{60}$, $C_{70}$, and the like.

Of the various fullerene derivatives listed above, it is especially preferable to use 60 PCBM ([6,6]-phenyl $C_{61}$ butyric acid methyl ester) or 70 PCBM ([6,6]-phenyl $C_{71}$ butyric acid methyl ester).

If an unmodified fullerene is used, it is preferable to use $C_{70}$. The fullerene $C_{70}$ has a high level of photocarrier generation efficiency, and is suited for use in an organic thin-film solar cell.

If the p-type semiconductor is P3AT, the mixture ratio n:p of n-type organic semiconductor and p-type semiconductor in the photoelectric conversion film 30 is preferably approximately 1:1. If the p-type semiconductor is a PCDTBT semiconductor, the mixture ratio n:p is preferably approximately 4:1.

In order to apply a coating of the organic semiconductor, it must be dissolved in a solvent. Examples of the solvent used to apply the coating include unsaturated hydrocarbon solvents, halogenated aromatic hydrocarbon solvents, halogenated saturated hydrocarbon solvents, ethers, and the like. Examples of unsaturated hydrocarbon solvents include toluene, xylene, tetralin, decalin, mesitylene, n-butyl benzene, sec-butyl benzene, tert-butyl benzene, and the like. Examples of halogenated aromatic hydrocarbon solvents include chlorobenzene, dichlorobenzene, trichlorobenzene, and the like. Examples of halogenated saturated hydrocarbon solvents include carbon tetrachloride, chloroform, dichloromethane, dichloroethane, chlorobutane, bromobutane, chloropentane, chlorohexane, bromohexane, chlorocyclohexane, and the like. Examples of ethers include tetrahydrofuran, tetrahydropyran, and the like. A halogen-based aromatic solvent is especially preferable. These various solvents may be used singly or in mixtures.

Examples of methods used to apply the solution and form a film include a spin coating method, a dip coating method, a casting method, a bar coating method, a roll coating method, a wire bar coating method, a spraying method, a screen printing method, a gravure printing method, a flexo printing method, a offset printing method, a gravure-offset printing method, a dispenser application method, a nozzle coating method, a capillary coating method, an inkjet printing method, and the like. These application methods may be used singly or in combination.

In this example, the stacked body SB further includes a conductive layer 60, an insulating layer 62, and an insulating portion 64. The lower electrode 10 includes a first portion 10a and a second portion 10b. The second portion 10b is aligned with the first portion 10a in a first direction parallel with the X-Y plane. The second portion 10b is aligned with the first portion 10a in, for example, the X-axis direction. The photoelectric conversion film 30 is provided on the first portion 10a.

The conductive layer 60 is provided on the second portion 10b, and is electrically connected to the lower electrode 10. The conductivity of the conductive layer 60 is greater than the conductivity of the lower electrode 10. A metal material, for example, is used for the conductive layer 60. More specifically, for example, a stacked film constituted by layers of molybdenum alloy and an aluminum and molybdenum alloy stacked in the Z-axis direction (a so-called MAM electrode layer) is used as the conductive layer 60. The second portion 10b and conductive layer 60 extend, for example, in the Y-axis direction. The conductive layer 60 facilitates, for example, the flow of current to the lower electrode 10 constituted by a transparent electrode. The conductive layer 60 is a so-called auxiliary interconnection.

The insulating layer 62 is provided above an end 10s of the lower electrode 10 in a direction parallel with the X-Y plane, and on an end 60s of the conductive layer 60 in a direction parallel with the X-Y plane. In this example, the insulating layer 62 is provided above a pair of ends 10s of the lower electrode 10 in the X-axis direction, and on a pair of ends 60s of the conductive layer 60 in the X-axis direction. In other words, the insulating layer 62 covers the ends 10s of the lower electrode 10 and the ends 60s of the conductive layer 60 in the Z-axis direction. The ends 10s and the ends 60s are not limited to ends in the X-axis direction, but may be ends in any direction parallel with the X-Y plane.

An opening 62a exposing at least part of the first portion 10a of the lower electrode 10 and an opening 62b exposing at least part of the conductive layer 60 are provided in the insulating layer 62. The lower intermediate layer 40 contacts, for example, the region of the lower electrode 10 that is exposed by the opening 62a. The region of the lower electrode 10 that is exposed by the opening 62a is, for example, a region that contributes to power generation.

A photosensitive polyimide, for example, is used for the insulating layer 62. The insulating layer 62 preferably has, for example, optical transparency. The insulating layer 62 is preferably, for example, transparent. This makes it possible, for example, to expand the region that contributes to power generation.

The ends 10s of the lower electrode 10 more readily generate leakage current than the portion of the lower electrode 10 that extends along the X-Y plane (i.e., the portion between the pair of ends 10s). Similarly, the ends 60s of the conductive layer 60 more readily generate leakage current than the portion of the conductive layer 60 that extends along the X-Y plane (i.e., the portion between the pair of ends 60s).

Therefore, the insulating layer 62 is provided above the ends 10s, 60s. This makes it possible, for example, to suppress the generation of leakage current at the ends 10s, 60s. It is possible, for example, to reduce serial resistance Rsh, increase the curve factor FF, and increase the open circuit voltage Voc. It is possible, for example, to improve the photoelectric conversion efficiency of the solar cell 110 over arrangements in which an insulating layer 62 is not provided.

The stacked body SB includes a first region R1 and a second region R2. The first region R1 is a region of the stacked body SB in which foreign matter 66 is present between the lower electrode 10 and the photoelectric conversion film 30. The second region R2 is a region of the stacked body SB in which foreign matter 66 is not present between the lower electrode 10 and the photoelectric conversion film 30.

The foreign matter 66 is unnecessary matter that contaminates the stacked body SB in the process of manufacturing the solar cell 110. The foreign matter 66 is, for example, residue produced in the formation of the conductive layer 60 or residue produced during the formation of the insulating layer 62. If the foreign matter 66 is residue of the conductive layer 60, the foreign matter 66 includes substantially the same material as the conductive layer 60. If the foreign matter 66 is residue of the insulating layer 62, the foreign matter 66 includes substantially the same material as the insulating layer 62. In other words, the foreign matter 66 may be conductive, or may be insulative. Multiple locations of foreign matter 66, for example, may be contained in the stacked body SB. The stacked body SB contains, for example, a plurality of first regions R1. The plurality of first regions R1 are, for example, sporadically present within a plane parallel with the X-Y plane. In this example, the stacked body SB includes two locations of foreign matter 66 and two first regions R1. Any number of locations of foreign matter 66 and first regions R1 may be contained in the stacked body SB.

The first region R1 has, for example, a shape similar to that of an island when projected in the X-Y plane. The second region R2 is, for example, a single continuous region encompassing the first region R1 when projected in the X-Y plane. The second region R2 encompasses, for example, each of the first regions R1 when projected in the X-Y plane.

The Z-axis directional length (height) of the foreign matter 66 is, for example, no more than the average thickness of the second region R2. The z-axis directional length of the foreign matter 66 is, for example, no more than 1 μm. The length of the foreign matter 66 in a direction parallel with the X-Y plane is, for example, no more than 10 μm. The area of the first region R1 when the stacked body SB is projected on the X-Y plane is, for example, no more than 5% of the area of the second region R2 when the stacked body SB is projected on the X-Y plane. The total area of the plurality of first regions R1 when the stacked body SB is projected on the X-Y plane is, for example, no more than 5% of the area of the second region R2 when the stacked body SB is projected on the X-Y plane.

The insulating portion 64 is provided between ends 66s of the foreign matter 66 and the upper electrode 20. In this example, the insulating portion 64 is provided between the ends 66s and the lower intermediate layer 40. The insulating portion 64 covers, for example, the ends 66s in the Z-axis direction. If there are multiple locations of foreign matter 66, multiple insulating portions 64 corresponding to each of the locations of foreign matter 66 are provided. In this example, the insulating portions 64 corresponding to each of the two locations of foreign matter 66 are provided.

The end 66s is an end of the foreign matter 66 in a first direction parallel with the X-Y plane. The end 66s is, for example, an X-axis directional end of the foreign matter 66. In this example, the insulating portion 64 is provided on the entirety of the foreign matter 66. The insulating portion 64 is provided between the foreign matter 66 and the photoelectric conversion film 30. The insulating portion 64 covers, for example, the entirety of the foreign matter 66 in the Z-axis direction. The insulating portion 64 overlaps, for example, the entire outer edge of the foreign matter 66 when projected on the X-Y plane. A resin material such as polyimide, for example, is used for the insulating portion 64. Substantially the same material as that of the insulating layer 62 is used, for example, for the insulating portion 64. The electrical resistivity of the insulating portion 64 is, for example, at least $10 \times 10^6$ Ω·m and no more than $10 \times 10^{17}$ Ω·m.

A distance D1 between the end 66s of the foreign matter 66 and the upper electrode 20 is greater than a distance D2 between the lower electrode 10 and the upper electrode 20 in the second region R2. The distance D1 and the distance D2 are distances in a second direction intersecting the X-Y plane. The distance D1 and the distance D2 are, for example, distances in the Z-axis direction. The second direction is, for example, a direction perpendicular to the upper surface 5a. The second direction may be any direction that intersects the upper surface 5a.

In this example, the insulating portion 64 is provided between the end 66s and the photoelectric conversion film 30. In other words, in this example, the distance D1 is greater than the distance D2 by the thickness of the insulating portion 64.

If foreign matter 66 is contained in the stacked body SB, leakage current is more readily generated at the end 66s of the foreign matter 66 than in the second region R2. By contrast, in the solar cell 110 according to the embodiment, an insulating portion 64 is provided, making the distance D1 longer than the distance D2. In other words, the resistance between the end 66s and the upper electrode 20 is increased over the resistance between the lower electrode 10 and the upper electrode 20 in the second region R2.

This makes it possible, for example, to suppress the generation of leakage current at the end 66s of the for example. It is possible, for example, to reduce serial resistance Rsh, increase the curve factor FF, and increase the open-circuit voltage Voc. It is possible, for example, to improve the photoelectric conversion efficiency of the solar cell 110 over that of an arrangement in which the distance D1 is less than the distance D2.

Figure 3A:
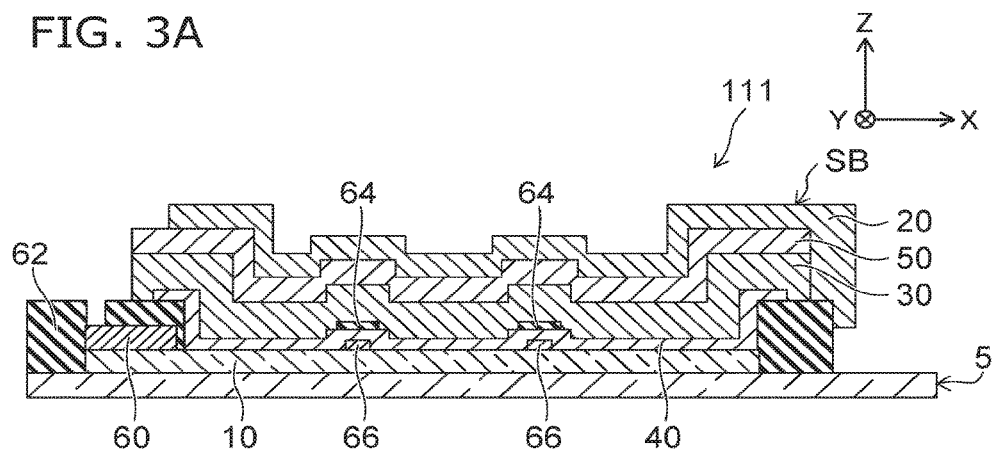
FIGS. 3A to 3C are schematic cross-sectional views illustrating other solar cells according to the first embodiment.
Figure 3B:
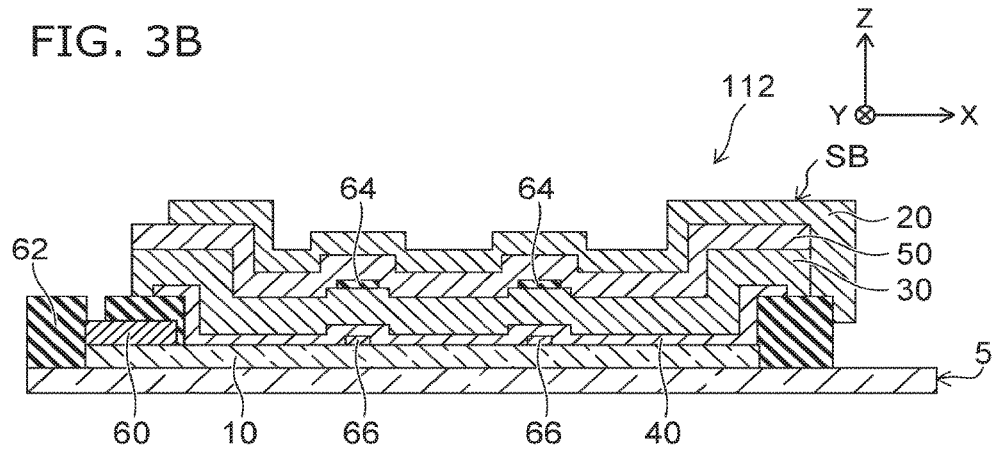
Figure 3C:
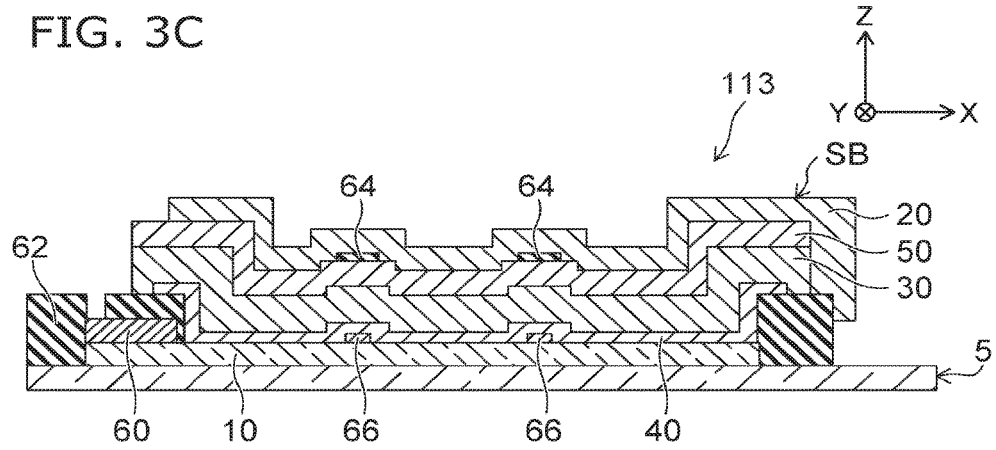

FIGS. 3A to 3C are schematic cross-sectional views illustrating other solar cells according to the first embodiment.

In a solar cell 111, as illustrated in FIG. 3A, the insulating portion 64 is provided between the lower intermediate layer 40 and the photoelectric conversion film 30 above the foreign matter 66.

In a solar cell 112, as illustrated in FIG. 3B, the insulating portion 64 is provided between the photoelectric conversion film 30 and the upper intermediate layer 50 above the foreign matter 66.

In a solar cell 113, as illustrated in FIG. 3C, the insulating portion 64 is provided between the upper intermediate layer 50 and the upper electrode 20 above the foreign matter 66.

As can be seen, the position at which the insulating portion 64 is provided may be any position between the end 66s of the foreign matter 66 and the upper electrode 20.

Figure 4A:
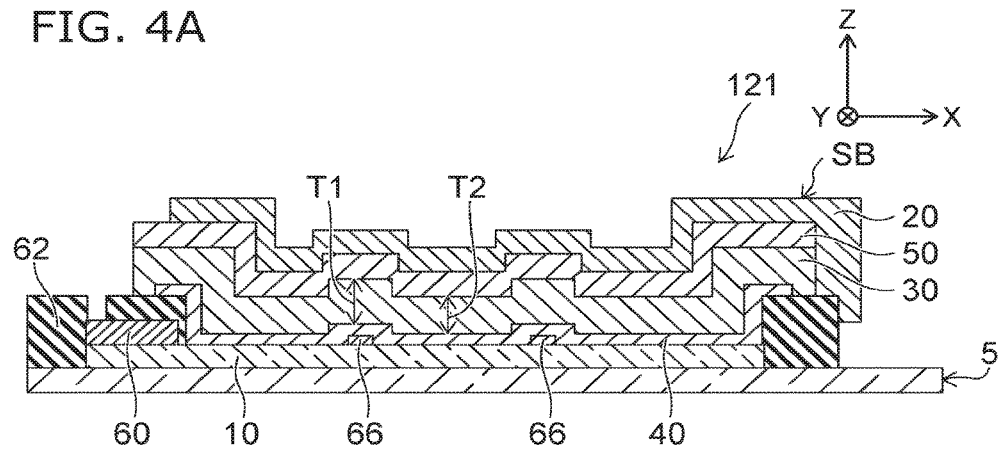
FIGS. 4A to 4C are schematic cross-sectional views illustrating other solar cells according to the first embodiment.
Figure 4B:
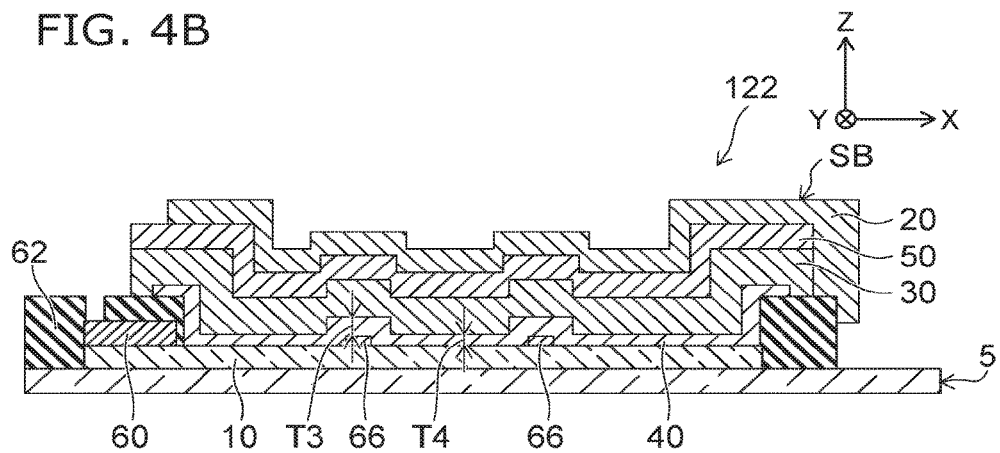
Figure 4C:
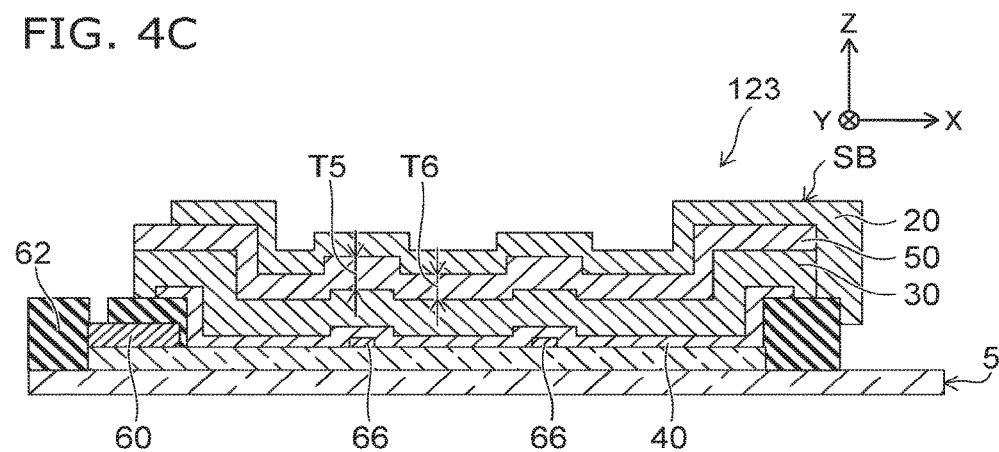

FIGS. 4A to 4C are schematic cross-sectional views illustrating other solar cells according to the first embodiment.

In a solar cell 121, as illustrated in FIG. 4A, the insulating portion 64 is omitted. In the solar cell 121, a thickness T1 (Z-axis directional length) of the photoelectric conversion film 30 above the end 66s of the foreign matter 66 is greater than a thickness T2 of the photoelectric conversion film 30 in the second region R2. In this way, the distance D1 may be made longer than the distance D2 by altering the thickness of the photoelectric conversion film 30 instead of providing an insulating portion 64. The solar cell 121 also allows for suppressed generation of leakage current at the end 66s of the foreign matter 66 and improved photoelectric conversion efficiency.

In a solar cell 122, as illustrated in FIG. 4B, a thickness T3 of the lower intermediate layer 40 above the end 66s of the foreign matter 66 is greater than a thickness T4 of the lower intermediate layer 40 in the second region R2. In this way, the distance D1 may be made longer than the distance D2 by altering the thickness of the lower intermediate layer 40 instead of providing an insulating portion 64. The solar cell 122 also allows for suppressed generation of leakage current at the end 66s of the foreign matter 66 and improved photoelectric conversion efficiency.

In a solar cell 123, as illustrated in FIG. 4C, a thickness T5 of the upper intermediate layer 50 above the end 66s of the foreign matter 66 is greater than a thickness T6 of the upper intermediate layer 50 in the second region R2. In this way, the distance D1 may be made longer than the distance D2 by altering the thickness of the upper intermediate layer 50 instead of providing an insulating portion 64. The solar cell 123 also allows for suppressed generation of leakage current at the end 66s of the foreign matter 66 and improved photoelectric conversion efficiency.

FIGS. 5A to 5E are schematic cross-sectional views illustrating other solar cells according to the first embodiment.

Figure 5A:
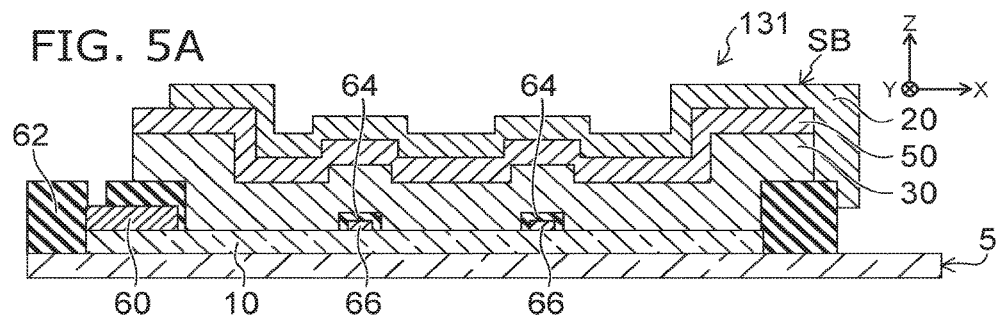
FIGS. 5A to 5E are schematic cross-sectional views illustrating other solar cells according to the first embodiment.
Figure 5B:
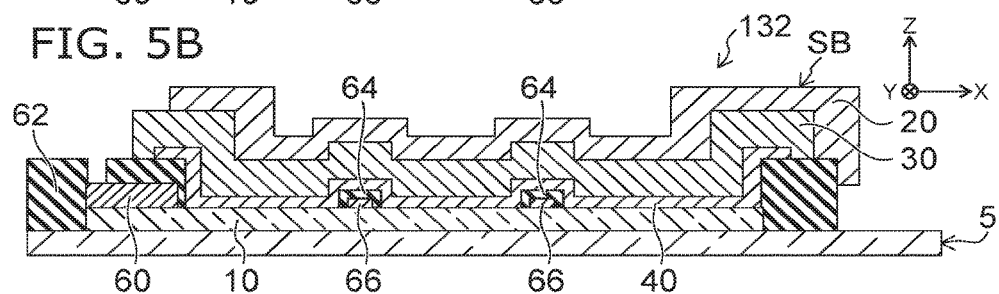
Figure 5C:
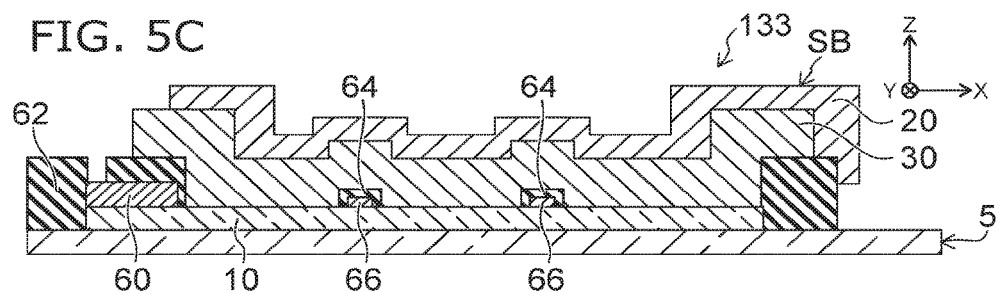

In a solar cell 131, as illustrated in FIG. 5A, the lower intermediate layer 40 is omitted. In a solar cell 132, as illustrated in FIG. 5B, the upper intermediate layer 50 is omitted. In a solar cell 133, as illustrated in FIG. 5C, the lower intermediate layer 40 and upper intermediate layer 50 are omitted.

Figure 5D:
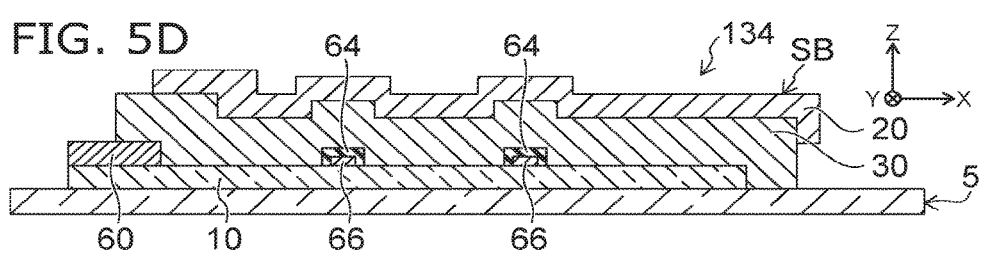

In a solar cell 134, as illustrated in FIG. 5D, the insulating layer 62 is also omitted.

Figure 5E:
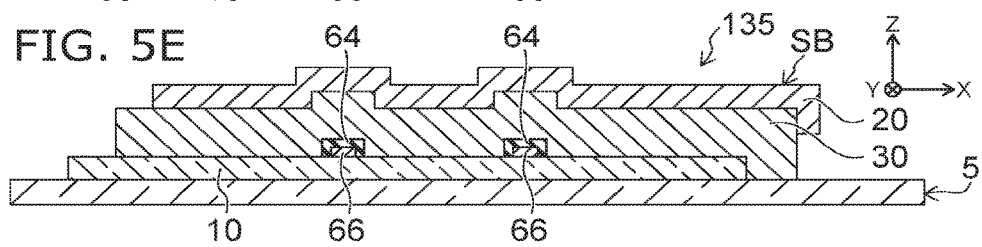

In a solar cell 135, as illustrated in FIG. 5E, the conductive layer 60 is also omitted.

In this way, the lower intermediate layer 40, upper intermediate layer 50 conductive layer 60, and insulating layer 62 may be provided or omitted as necessary. The stacked body SB needs only include at least the lower electrode 10, the upper electrode 20, and the photoelectric conversion film 30, as in the case of solar cell 135.

Figure 6A:
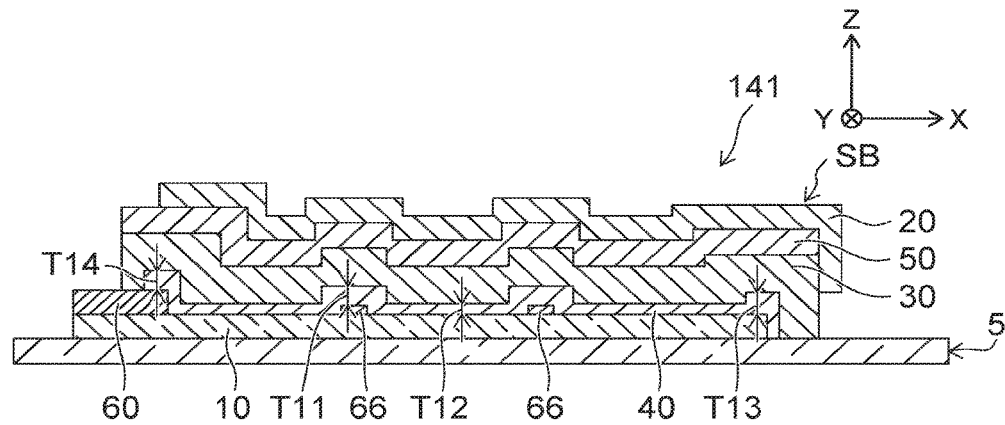
FIGS. 6A to 6C are schematic cross-sectional views illustrating other solar cells according to the first embodiment.
Figure 6B:
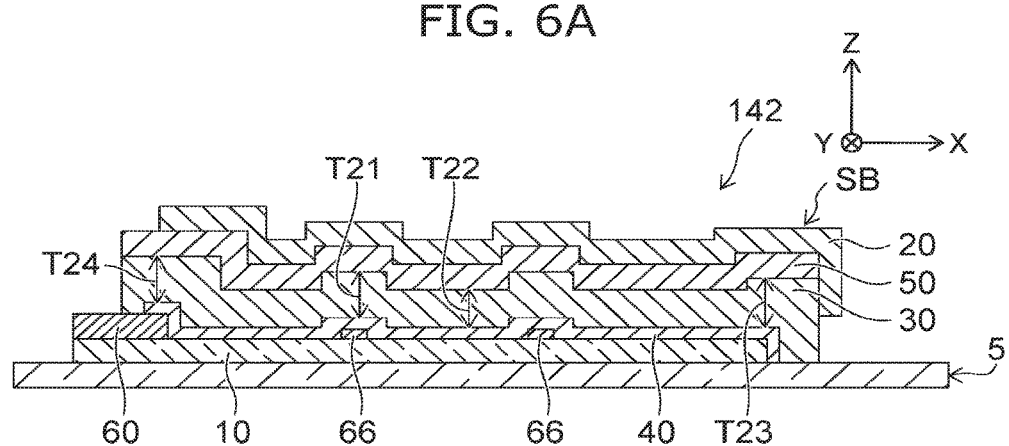
Figure 6C:
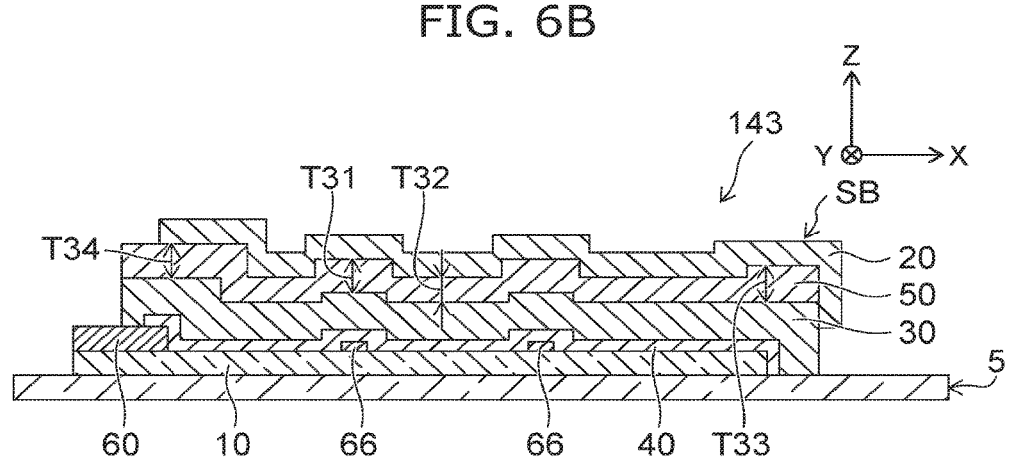

FIGS. 6A to 6C are schematic cross-sectional views illustrating other solar cells according to the first embodiment.

In a solar cell 141, as illustrated in FIG. 6A, the insulating layer 62 and insulating portion 64 are omitted. In the solar cell 141, a thickness T11 of the lower intermediate layer 40 above the end 66s of the foreign matter 66 is greater than a thickness T12 of the lower intermediate layer 40 in the second region R2. In the solar cell 141, a thickness T13 of the lower intermediate layer 40 above the ends 10s of the lower electrode 10 is greater than the thickness T12 of the lower intermediate layer 40 in the second region R2. In the solar cell 141, a thickness T14 of the lower intermediate layer 40 above the end 60s of the conductive layer 60 is greater than the thickness T12 of the lower intermediate layer 40 in the second region R2.

In this way, resistance in the portion above the ends 10s may be increased by increasing the thickness of the lower intermediate layer 40 above the ends 10s rather than providing the insulating layer 62. The resistance in the portion above the ends 60s may be increased by increasing the thickness of the lower intermediate layer 40 over the ends 60s. It is thereby possible, for example, to suppress the generation of leakage current at the ends 10s and the ends 60s. It is also possible to improve the photoelectric conversion efficiency of the solar cell 141.

In a solar cell 142, as illustrated in FIG. 6B, the insulating layer 62 and the insulating portion 64 are omitted. In the solar cell 142, a thickness T21 of the photoelectric conversion film 30 above the end 66s of the foreign matter 66 is greater than a thickness T22 of the photoelectric conversion film 30 in the second region R2. In the solar cell 142, a thickness T23 of the photoelectric conversion film 30 above the ends 10s of the lower electrode 10 is greater than the thickness T22 of the photoelectric conversion film 30 in the second region R2. In the solar cell 142, a thickness T24 of the photoelectric conversion film 30 above the ends 60s of the conductive layer 60 is greater than the thickness T22 of the photoelectric conversion film 30 in the second region R2.

The solar cell 142 thereby also allows, for example, for suppressed the generation of leakage current at the ends 10s and the ends 60s, and improved photoelectric conversion efficiency.

In a solar cell 143, as illustrated in FIG. 6C, the insulating layer 62 and the insulating portion 64 are omitted. In the solar cell 143, a thickness T31 of the upper intermediate layer 50 above the end 66s of the foreign matter 66 is greater than a thickness T32 of the upper intermediate layer 50 in the second region R2. In the solar cell 143, a thickness T33 of the upper intermediate layer 50 above the ends 10s of the lower electrode 10 is greater than the thickness T32 of the upper intermediate layer 50 in the second region R2. In the solar cell 143, a thickness T34 of the upper intermediate layer 50 above the ends 60s of the conductive layer 60 is greater than the thickness T32 of the upper intermediate layer 50 in the second region R2.

The solar cell 143 thereby also allows, for example, for suppressed the generation of leakage current at the ends 10s and the ends 60s, and improved photoelectric conversion efficiency.

Figure 7:
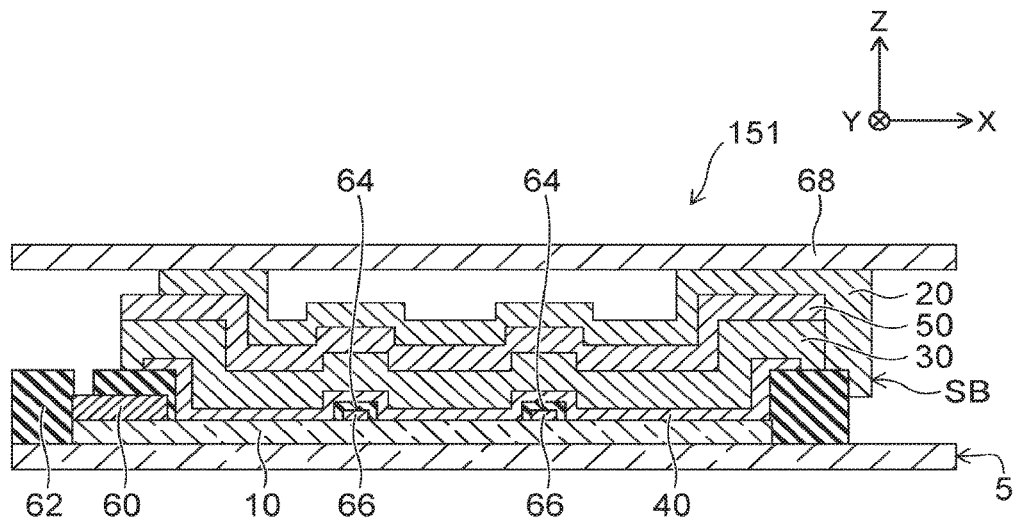
FIG. 7 is a schematic cross-sectional view illustrating another solar cell according to the first embodiment.

FIG. 7 is a schematic cross-sectional view illustrating another solar cell according to the first embodiment.

As illustrated in FIG. 7, a solar cell 151 further includes a sealing film 68. The sealing film 68 is provided on the stacked body SB. In other words, the sealing film 68 is provided on the upper electrode 20. The sealing film 68 is bonded to the upper electrode 20 using, for example, a thermosetting or ultraviolet curing epoxy resin. The sealing film 68 protects the photoelectric conversion film 30 and the like from, for example, oxygen and moisture. The provision of the sealing film 68 allows, for example, the durability of the solar cell 151 to be improved.

A film obtained by providing a layer made of inorganic material or metal upon the surface of a metal sheet or resin film, for example, may be used as the sealing film 68. Examples of usable resin films include films of polyethylene terephthalate (PET), polyethylene naphthalate (PEN), polyimide (PI), ethylene vinyl alcohol (EVOH), cyclic olefin (CO), ethylene vinyl acetate (EVA), polycarbonate (PC), or poly ether sulpone (PES), or multilayer films containing two or more of these. Examples of usable inorganic materials or metals include at least any one of silica, titania, zirconia, silicon nitride, boron nitride, and aluminum. The sealing film 68 may further contain, for example, a desiccant or oxygen absorption agent. It is thereby possible, for example, to further improve the durability of the solar cell 151.

Figure 8:
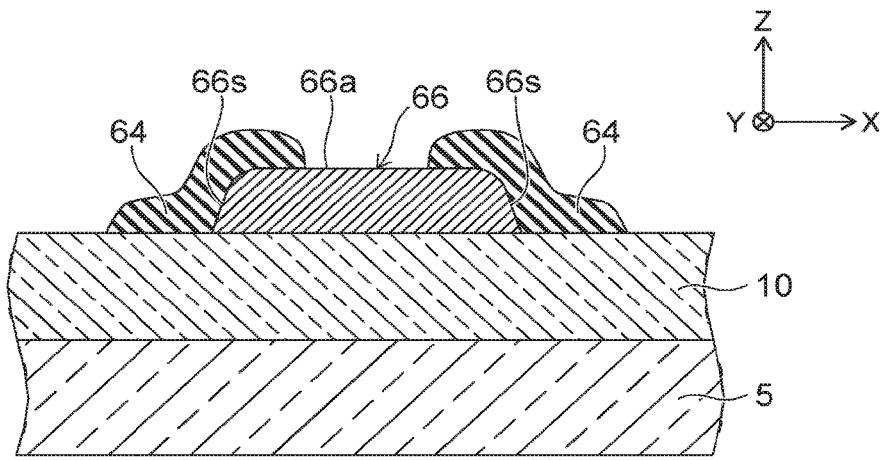
FIG. 8 is a schematic cross-sectional view illustrating part of another solar cell according to the first embodiment.

FIG. 8 is a schematic cross-sectional view illustrating part of another solar cell according to the first embodiment.

In this example, as illustrated in FIG. 8, the insulating portion 64 does not cover part of an upper end 66a of the foreign matter 66. In this way, the insulating portion 64 needs only be provided between the ends 66s of the foreign matter 66 and the upper electrode 20. However, the insulating portion 64 is provided over the entirety of the foreign matter 66, as discussed above. This allows the generation of leakage current in the foreign matter 66 to be suitably suppressed.

The configurations of the various solar cells 110 to 113, 121 to 123, 131 to 135, 141 to 143, and 151 may be combined as desired. For example, it is acceptable to provide an insulating portion 64, and increase the thickness of the photoelectric conversion film 30 in the first region R1 over the thickness of the photoelectric conversion film 30 in the second region R2. The thickness of the photoelectric conversion film 30, the lower intermediate layer 40, and the upper intermediate layer 50 in the first region R1 may be greater than the thicknesses thereof in the second region R2.

Next, a method for manufacturing the solar cell 110 will be described. Here, a method for manufacturing the solar cell 110 will be described.

FIGS. 9A to 9D and FIGS. 10A to 10D are schematic cross-sectional views illustrating an example of a process of manufacturing a solar cell according to the first embodiment.

Figure 9A:
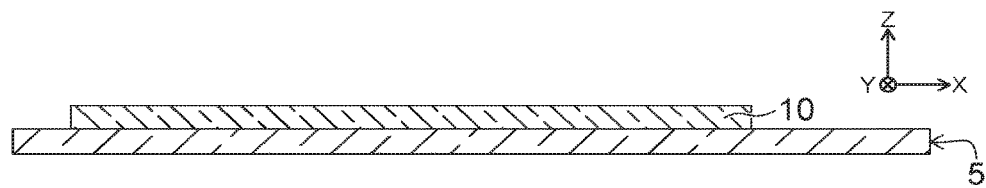
FIGS. 9A to 9D are schematic cross-sectional views illustrating an example of a process of manufacturing a solar cell according to the first embodiment.

As illustrated in FIG. 9A, to manufacture the solar cell 110, the lower electrode 10 is first formed on the upper surface 5a of the substrate 5 via a film formation treatment such as a sputtering method, a patterning treatment, and the like.

Figure 9B:
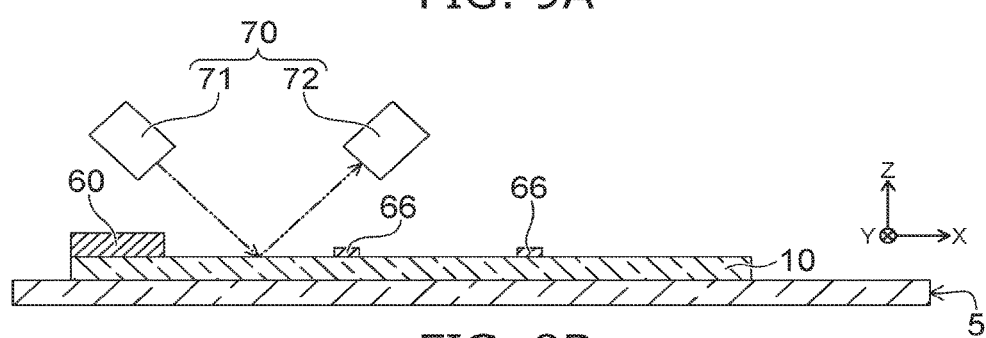

As illustrated in FIG. 9B, the conductive layer 60 is formed on the second portion 10b of the lower electrode 10 via the film formation treatment, patterning treatment, and the like. After the conductive layer 60 has been formed, foreign matter 66 upon the lower electrode 10 is detected using an optical sensor 70. The optical sensor 70 includes, for example, a light-emitting part 71 and a light-receiving part 72. The light-emitting part 71 irradiates an inspection target with inspection light. The light-receiving part 72 receives the inspection light reflecting off the inspection target. Specifically, the optical sensor is, for example, a reflective sensor.

The optical sensor 70 is electrically connected, for example, to a control unit not illustrated in the drawings. The optical sensor 70 is also mounted, for example, to a movement mechanism capable of moving in the X-axis direction and the Y-axis direction. The control unit alters, for example, the relative positions of the optical sensor 70 and the substrate 5 to perform detection over the entirety of the upper surface 5a of the substrate 5 constituting the inspection target. Detection may be performed over the entirety of the upper surface 5a by moving the substrate 5, or by moving both the substrate 5 and the optical sensor 70.

A design pattern for the conductive layer 60, for example, is pre-stored in the control unit. As discussed above, the substrate 5 and the lower electrode 10 have optical transparency. Thus, the control unit compares light reception data from the light-receiving part 72 and data for the design pattern, and, if inspection light is received by the light-receiving part 72 at a location where the design pattern is not present, determines that foreign matter 66 is present at that location. The optical sensor 70 is thereby capable of detecting the presence or lack of foreign matter 66. The sensor is also capable of detecting information such as the position or size of the foreign matter 66. The control unit stores, for example, inspection information for the position, size, and the like of the detected foreign matter 66 in a server or the like.

Figure 9C:
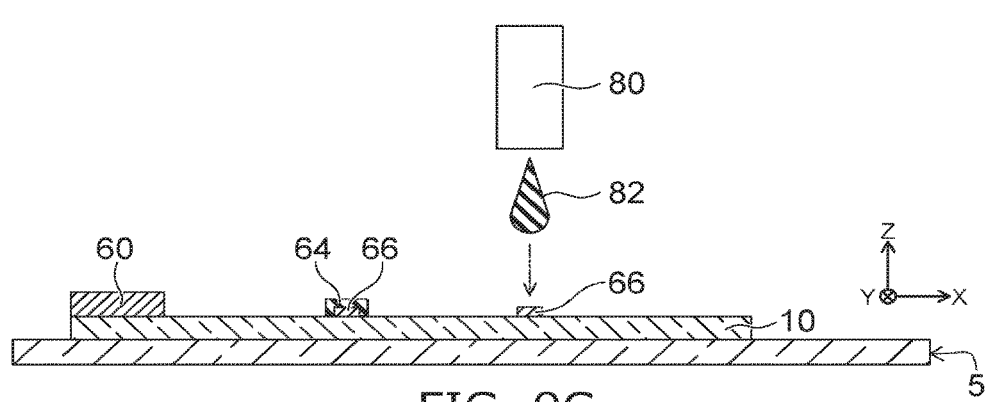

As illustrated in FIG. 9C, repair fluid 82 is dispensed onto at least the end 66s of the detected foreign matter 66 by a drop dispenser unit 80. An inkjet head or dispenser, for example, is used as the drop dispenser unit 80. The drop dispenser unit 80 may be any device capable of dispensing the repair fluid 82. In this example, an insulating material such as a photosensitive polyimide, for example, is used in the repair fluid 82. In this example, the repair fluid 82 contains an insulating material.

The drop dispenser unit 80 is electrically connected, for example, to a control unit not illustrated in the drawings. The control unit connected to the drop dispenser unit 80 may be the same control unit as that connected to the optical sensor 70, or a different control unit. For example, if the optical sensor 70 and the drop dispenser unit 80 are incorporated into the same apparatus, the optical sensor 70 and the drop dispenser unit 80 are connected to the same control unit. If, for example, the optical sensor 70 and the drop dispenser unit 80 are incorporated into different apparatus, the optical sensor 70 and the drop dispenser unit 80 are connected to different control units.

The drop dispense unit 80 is also mounted on a movement mechanism or the like. The drop dispenser unit 80, like the optical sensor 70, alters its position relative to the substrate 5 in a direction parallel with the X-Y plane.

The control unit reads, for example, inspection information stored in a server or the like via a network. If the optical sensor 70 and the drop dispenser unit 80 are connected to the same control unit, inspection information may be stored in the control unit.

Based on the read inspection information, the control unit dispenses repair fluid 82 over the end 66s of the detected foreign matter 66. In this example, repair fluid 82 is dispensed over the entirety of the foreign matter 66. An insulating portion 64 is thereby formed over the foreign matter 66. The amount of repair fluid 82 dispensed over the foreign matter 66 when forming the insulating portion 64 is not limited to being one drop, but may be multiple drops. Based, for example, on the size of the foreign matter 66 contained in the inspection information and the pre-stored amount of liquid in a single drop of repair fluid 82, the control unit calculates the number of drops of repair fluid 82 necessary to form the insulating portion 64, and dispenses a number of drops of repair fluid 82 according to the calculated results. If foreign matter 66 is detected at multiple locations, repair fluid 82 is dispensed over each of the multiple locations of foreign matter 66 to form insulating portions 64 over each of the multiple locations of foreign matter 66.

Figure 9D:
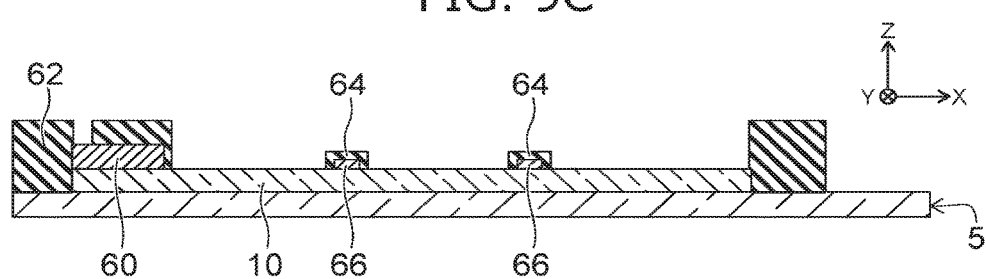

As illustrated in FIG. 9D, the insulating layer 62 is formed above the substrate 5, the lower electrode 10, and the conductive layer 60 via the film formation treatment, patterning treatment, and the like. In this example, the insulating layer 62 is formed after the insulating portion 64 has been formed. It is also acceptable to perform this process in reverse and form the insulating portion 64 after the insulating layer 62 has been formed.

Figure 10A:
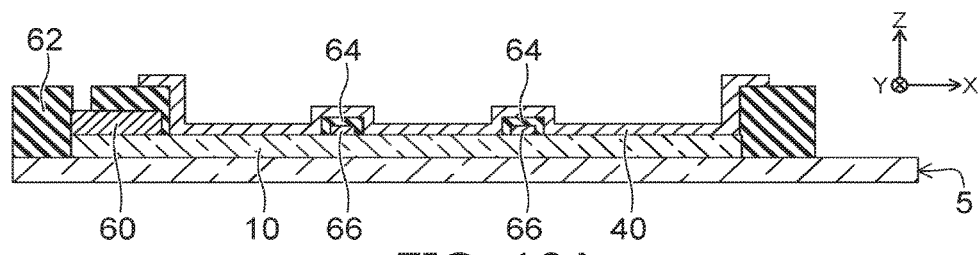
FIGS. 10A to 10D are schematic cross-sectional views illustrating an example of a process of manufacturing a solar cell according to the first embodiment.

As illustrated in FIG. 10A, the lower intermediate layer 40 is formed above the lower electrode 10, the insulating layer 62, and the insulating portion 64 via the film formation treatment, patterning treatment, and the like.

Figure 10B:
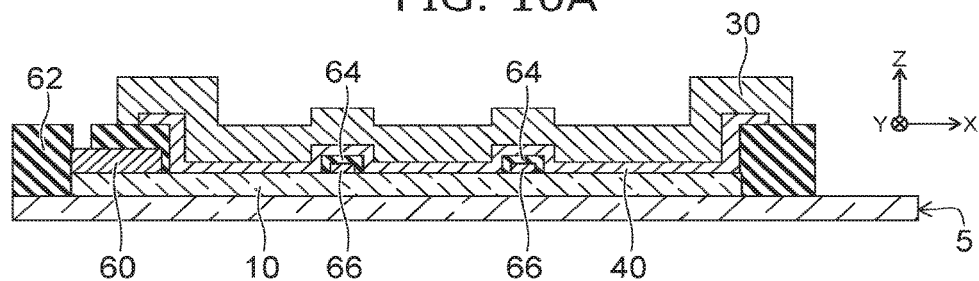

As illustrated in FIG. 10B, the photoelectric conversion film 30 is formed on the lower intermediate layer 40 via the film formation treatment, patterning treatment, and the like.

Figure 10C:
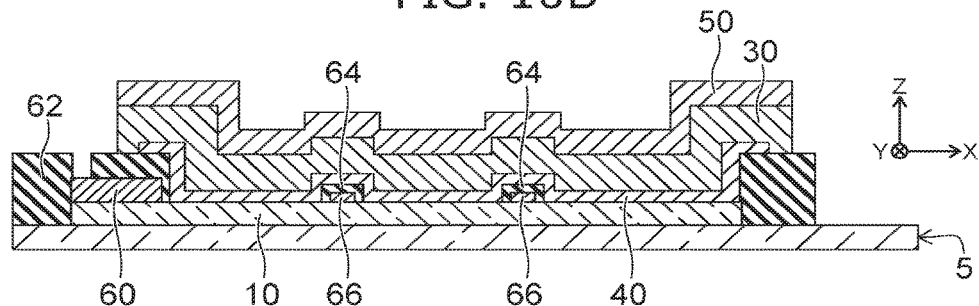

As illustrated in FIG. 10C, the upper intermediate layer 50 is formed on the photoelectric conversion film 30 via the film formation treatment, patterning treatment, and the like.

Figure 10D:
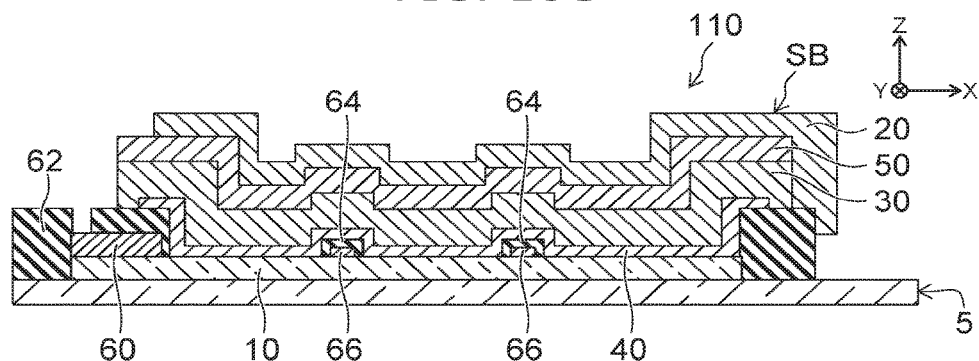

As illustrated in FIG. 10D, the upper electrode 20 is formed on the upper intermediate layer 50 via the film formation treatment, patterning treatment, and the like.

The stacked body SB is thereby formed on the upper surface 5a of the substrate 5, thereby completing the solar cell 110.

For example, after performing the procedure like that described above up to the formation of the conductive layer 60 and the detection of the foreign matter 66, the insulating layer 62 is formed, and then the lower intermediate layer 40 is formed. Repair fluid 82 is then dispensed over the lower intermediate layer 40 to form the insulating portion 64.

It is thereby possible to form the solar cell 111 described above.

For example, after performing the procedure like that described above up to the formation of the conductive layer 60 and the detection of the foreign matter 66, the insulating layer 62 is formed, the lower intermediate layer 40 is formed, and then the photoelectric conversion film 30 is formed. Repair fluid 82 is then dispensed over the photoelectric conversion film 30 to form the insulating portion 64.

It is thereby possible to form the solar cell 112 described above.

For example, after performing the procedure like that described above up to the formation of the conductive layer 60 and the detection of the foreign matter 66, the insulating layer 62 is formed, the lower intermediate layer 40 is formed, the photoelectric conversion film 30 is formed, and then the upper intermediate layer 50 is formed. Repair fluid 82 is then dispensed over the upper intermediate layer 50 to form the insulating portion 64.

It is thereby possible to form the solar cell 113 described above.

Figure 11A:
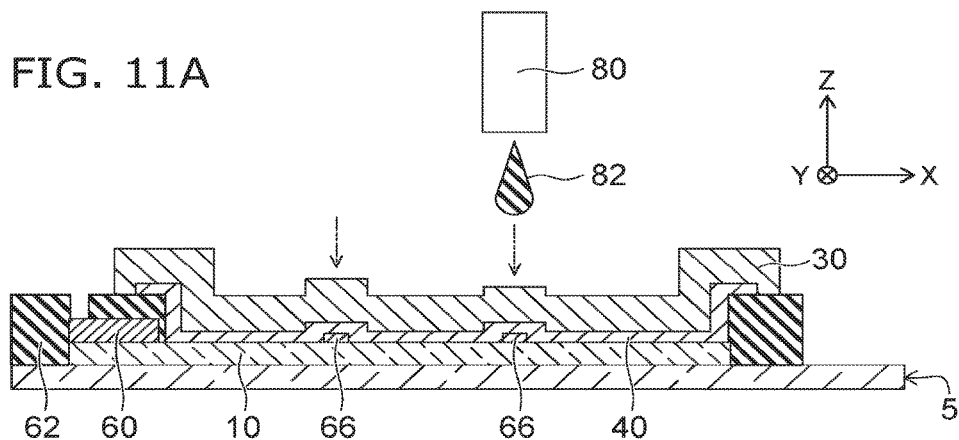
FIGS. 11A to 11C are schematic cross-sectional views illustrating an example of a process for manufacturing another solar cell according to the first embodiment.
Figure 11B:
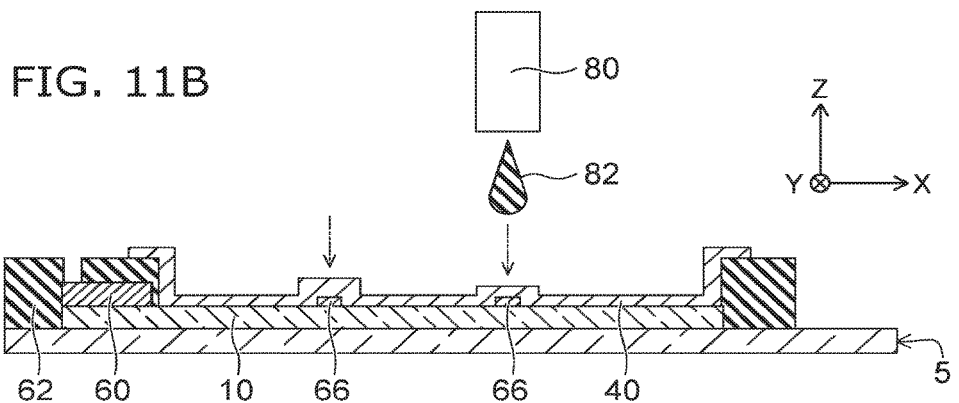
Figure 11C:
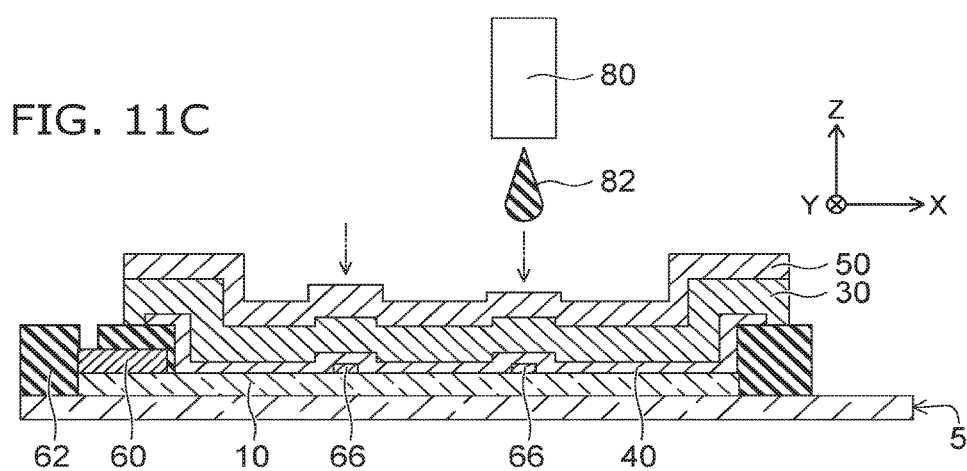

FIGS. 11A to 11C are schematic cross-sectional views illustrating an example of a process for manufacturing another solar cell according to the first embodiment.

As illustrated in FIG. 11A, after performing a procedure like that described above up to the formation of the conductive layer 60 and the detection of foreign matter 66, the insulating layer 62 and lower intermediate layer 40 are formed, and then a photoelectric conversion film 30 of substantially uniform thickness is formed on the lower intermediate layer 40. The drop dispenser unit 80 then dispenses repair fluid 82 containing the same material as the photoelectric conversion film 30 onto the photoelectric conversion film 30. More specifically, repair fluid 82 containing the same material as the first semiconductor layer 30n is dispensed onto the photoelectric conversion film 30. This causes the thickness T1 of the photoelectric conversion film 30 above the end 66s of the foreign matter 66 to be greater than the thickness T2 of the photoelectric conversion film 30 in the second region R2.

It is thereby possible to form the solar cell 121 described above.

As illustrated in FIG. 11B, after performing a procedure like that described above up to the formation of the conductive layer 60 and the detection of foreign matter 66, the insulating layer 62 is formed, and then a lower intermediate layer 40 of substantially uniform thickness is formed on the lower electrode 10. The drop dispenser unit 80 then dispenses repair fluid 82 containing the same material as the lower intermediate layer 40 onto the lower intermediate layer 40. For example, repair fluid 82 containing TiOx is dispensed onto the lower intermediate layer 40. This causes the thickness T3 of the lower intermediate layer 40 above the end 66s of the foreign matter 66 to be greater than the thickness T4 of the lower intermediate layer 40 in the second region R2.

It is thereby possible to form the solar cell 122 described above.

As illustrated in FIG. 11A, after performing a procedure like that described above up to the formation of the conductive layer 60 and the detection of foreign matter 66, the insulating layer 62, lower intermediate layer 40 and photoelectric conversion film 30 are formed, and then an upper intermediate layer 50 of substantially uniform thickness is formed on the photoelectric conversion film 30. The drop dispenser unit 80 then dispenses repair fluid 82 containing the same material as the upper intermediate layer 50 onto the upper intermediate layer 50. For example, repair fluid 82 containing poly(3,4-ethylenedioxythiophene) polystyrene sulfonate (PEDOT/PSS) is dispensed onto the upper intermediate layer 50. This causes the thickness T5 of the upper intermediate layer 50 above the end 66s of the foreign matter 66 to be greater than the thickness T6 of the upper intermediate layer 50 in the second region R2.

It is thereby possible to form the solar cell 123 described above.

Figure 12A:
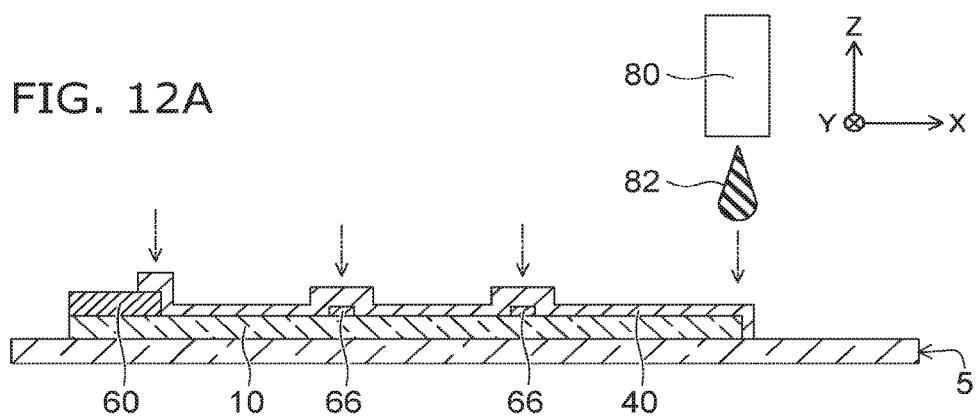
FIGS. 12A to 12C are schematic cross-sectional views illustrating an example of a process for manufacturing another solar cell according to the first embodiment.
Figure 12B:
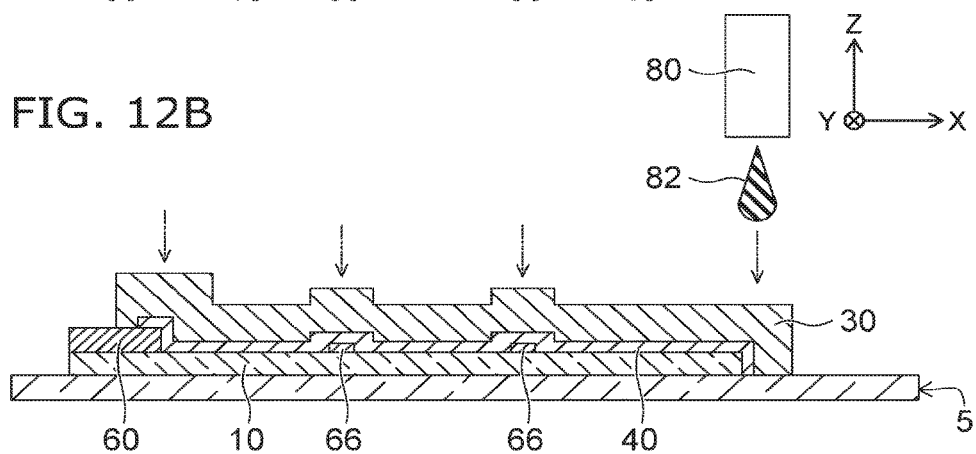
Figure 12C:
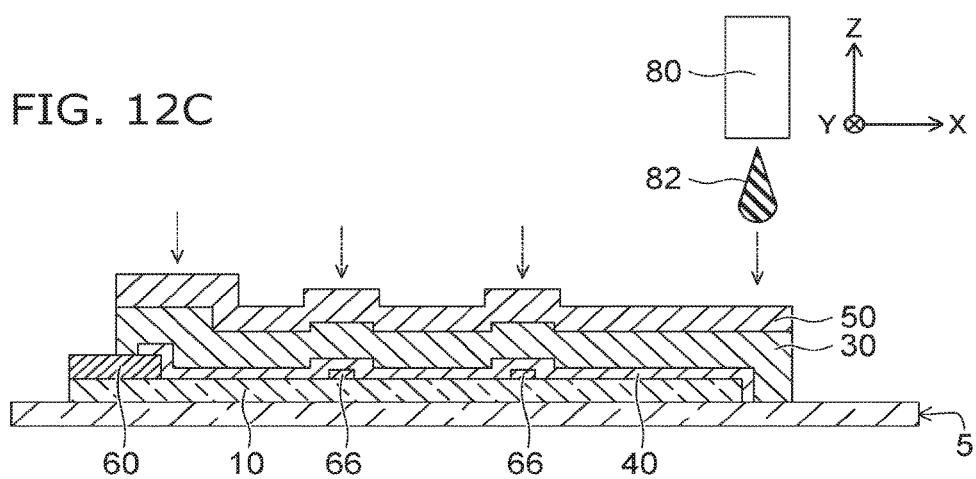

FIGS. 12A to 12C are schematic cross-sectional views illustrating an example of a process for manufacturing another solar cell according to the first embodiment.

As illustrated in FIG. 11A, after performing a procedure like that described above up to the formation of the conductive layer 60 and the detection of foreign matter 66, a lower intermediate layer 40 of substantially uniform thickness is formed on the lower electrode 10. Repair fluid 82 containing the same material as the lower intermediate layer 40 is then dispensed onto the lower intermediate layer 40. This causes the thickness T11 of the lower intermediate layer 40 above the end 66s of the foreign matter 66 to be greater than the thickness T12 of the lower intermediate layer 40 in the second region R2. The thickness T13 of the lower intermediate layer 40 above the ends 10s of the lower electrode 10 is made greater than the thickness T12 of the lower intermediate layer 40 in the second region R2. The thickness T14 of the lower intermediate layer 40 above the ends 60s of the conductive layer 60 is also made greater than the thickness T12 of the lower intermediate layer 40 in the second region R2.

It is thereby possible to form the solar cell 141 described above.

As illustrated in FIG. 12B, after performing a procedure like that described above up to the formation of the conductive layer 60 and the detection of foreign matter 66, the lower intermediate layer 40 is formed, and then a photoelectric conversion film 30 of substantially uniform thickness is formed on the lower intermediate layer 40. The drop dispenser unit 80 then dispenses repair fluid 82 containing the same material as the photoelectric conversion film 30 onto the photoelectric conversion film 30. This causes the thickness T21 of the photoelectric conversion film 30 above the end 66s of the foreign matter 66 to be greater than the thickness T22 of the photoelectric conversion film 30 in the second region R2. The thickness T23 of the photoelectric conversion film 30 above the ends 10s of the lower electrode 10 is made greater than the thickness T22 of the photoelectric conversion film 30 in the second region R2. The thickness T24 of the photoelectric conversion film 30 above the ends 60s of the conductive layer 60 is also made greater than the thickness T22 of the photoelectric conversion film 30 in the second region R2.

It is thereby possible to form the solar cell 142 described above.

As illustrated in FIG. 12C, after performing a procedure like that described above up to the formation of the conductive layer 60 and the detection of foreign matter 66, the lower intermediate layer 40 and the photoelectric conversion film 30 are formed, and then an upper intermediate layer 50 of substantially uniform thickness is formed on the photoelectric conversion film 30. The drop dispenser unit 80 then dispenses repair fluid 82 containing the same material as the upper intermediate layer 50 onto the upper intermediate layer 50. This causes the thickness T31 of the upper intermediate layer 50 above the end 66s of the foreign matter 66 to be greater than the thickness T32 of the upper intermediate layer 50 in the second region R2. The thickness T33 of the upper intermediate layer 50 above the ends 10s of the lower electrode 10 is made greater than the thickness T32 of the upper intermediate layer 50 in the second region R2. The thickness T34 of the upper intermediate layer 50 above the ends 60s of the conductive layer 60 is also made greater than the thickness T32 of the upper intermediate layer 50 in the second region R2.

It is thereby possible to form the solar cell 143 described above.

Figure 13A:
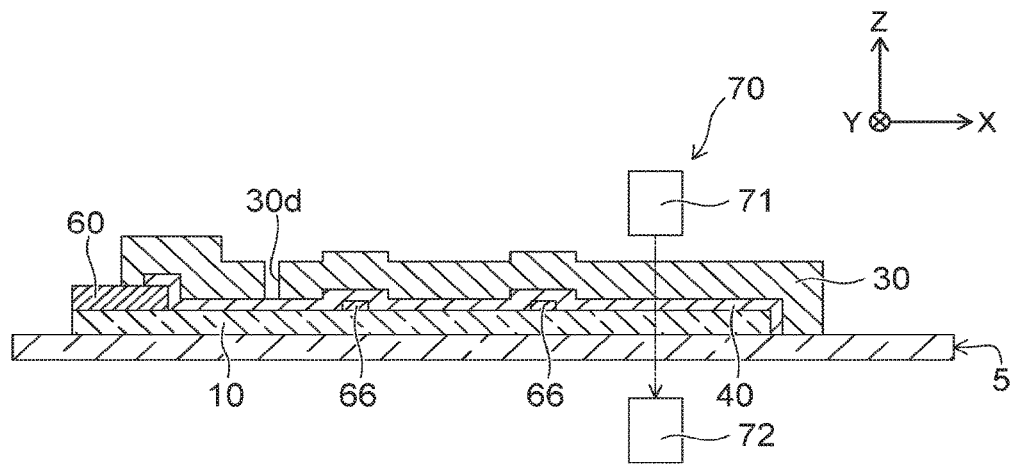
FIGS. 13A to 13B are schematic cross-sectional views illustrating an example of a process for manufacturing another solar cell according to the first embodiment.
Figure 13B:
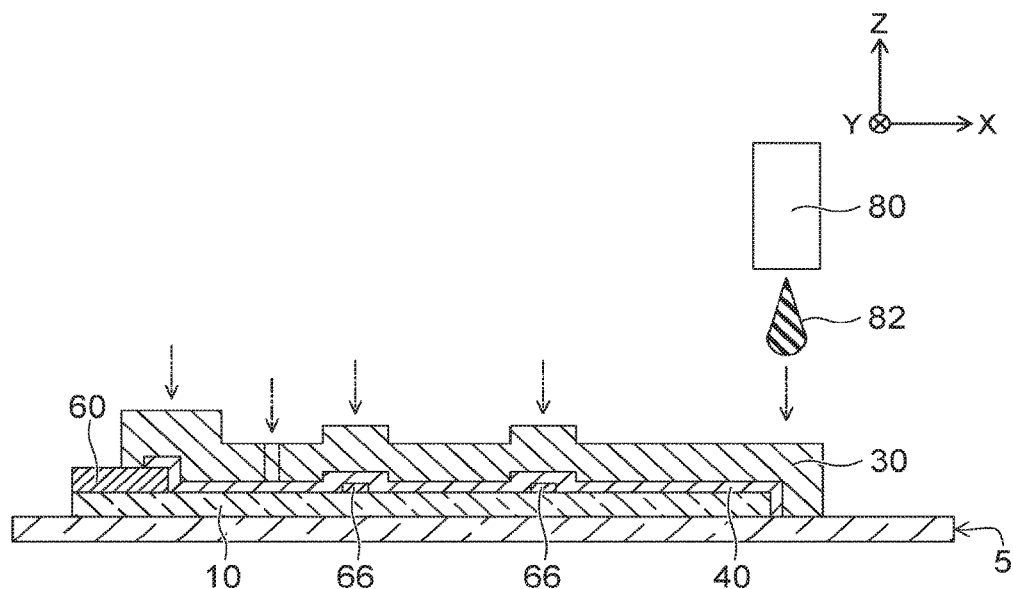

FIGS. 13A and 13B are schematic cross-sectional views illustrating an example of a process for manufacturing another solar cell according to the first embodiment.

In this example, as illustrated in FIG. 13A, after the lower electrode 10, the conductive layer 60, the lower intermediate layer 40, and the photoelectric conversion film 30 have been formed, foreign matter 66 is detected using the optical sensor 70. In this example, the light-receiving part 72 receives inspection light that has passed through the inspection target. In other words, the optical sensor 70 in this example is a transmissive sensor.

The control unit compares light reception data from the light-receiving part 72 and data for the design pattern, and, if the reception of inspection light by the light-receiving part 72 is blocked at a location where the design pattern is not present, determines that foreign matter 66 is present at that location.

The design pattern of the photoelectric conversion film 30 is also pre-stored in the control unit. The control unit compares, for example, light reception data from the light-receiving part 72 and design pattern data and, if light of intensity greater than a reference value is detected at a portion where the design pattern is not present, determines that a defect 30d in the photoelectric conversion film 30 is present at that portion. The defect 30d is, for example, a so-called pinhole in which the photoelectric conversion film 30 is partially flawed.

As illustrated in FIG. 13B, after detecting foreign matter 66 and defects 30d, the drop dispenser unit 80 dispenses repair fluid 82 containing the same material as the photoelectric conversion film 30 onto the photoelectric conversion film 30. This causes the thickness T21 of the photoelectric conversion film 30 above the end 66s of the foreign matter 66 to be greater than the thickness T22 of the photoelectric conversion film 30 in the second region R2. The thickness T23 of the photoelectric conversion film 30 above the ends 10s of the lower electrode 10 is made greater than the thickness T22 of the photoelectric conversion film 30 in the second region R2. The thickness T24 of the photoelectric conversion film 30 above the ends 60s of the conductive layer 60 is made greater than the thickness T22 of the photoelectric conversion film 30 in the second region R2.

Repair fluid 82 is also dispensed over the detected defects 30d. The defects 30d are filled in, for example, by the repair fluid 82.

In this way, the detection of foreign matter 66 may be performed after the photoelectric conversion film 30 has been formed. Defect 30d detection is performed along with the detection of the foreign matter 66, and repair fluid 82 is dispensed over the defect 30d. It is thereby possible, for example, to suppress leakage current generated at the defect 30d. It is possible, for example, to improve the photoelectric conversion efficiency of the solar cell 142.

If, for example, repair fluid 82 is dispensed onto the lower intermediate layer 40, the detection of foreign matter 66 may be performed after the lower intermediate layer 40 has been formed. If repair fluid 82 is dispensed onto the upper intermediate layer 50, the detection of foreign matter 66 may be performed after the upper intermediate layer 50 has been formed.

The optical sensor 70 may be transmissive or reflective. Alternatively, for example, an imaging element such as a CCD image sensor or a CMOS image sensor may be used as the optical sensor 70 to detect foreign matter 66 via image processing.

Second Embodiment

Figure 14A:
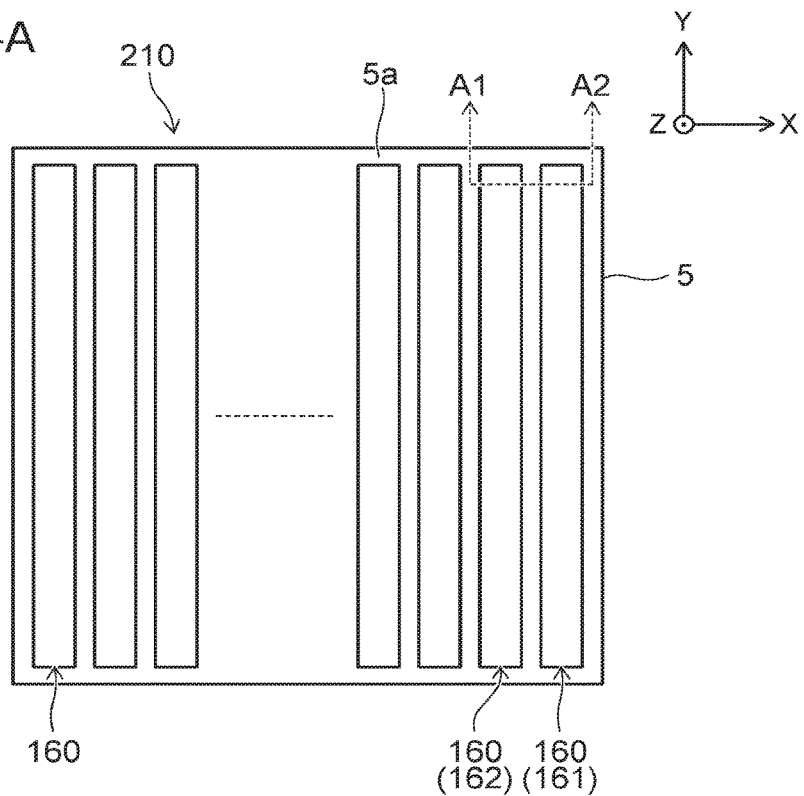
FIGS. 14A and 14B are schematic illustrations of a solar cell module according to a second embodiment.
Figure 14B:
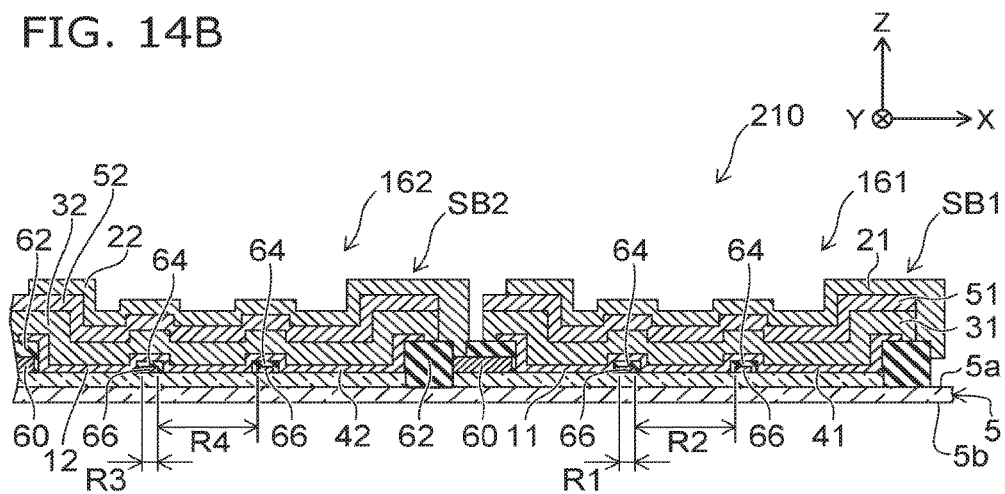

FIGS. 14A and 14B are schematic illustrations of a solar cell module according to a second embodiment.

FIG. 14A is a schematic plan view of a solar cell module, and FIG. 14B is a schematic partial cross-sectional view illustrating a part of a solar cell module. FIG. 14B is a schematic illustration of the cross section along line A1-A2 in FIG. 14A.

As illustrated in FIGS. 14A and 14B, a solar cell module 210 includes a substrate 5 and a plurality of solar cells 160 (so-called cells). The substrate 5 includes an upper surface 5a and a lower surface 5b. The substrate 5 (upper surface 5a) has, for example, a rectangular shape when projected onto the X-Y plane.

The plurality of solar cells 160 are provided in a row upon the upper surface 5a. In this example, the solar cells 160 have rectangular shapes extending in the Y-axis direction when projected onto the X-Y plane. In this example, the plurality of solar cells 160 are arranged in a row in the X-axis direction with a predetermined spacing therebetween. The X-axis directional width (length in the X-axis direction) of the solar cells 160 is, for example, approximately from 10 to 15 mm. The length of one side of the substrate 5 is, for example, 30 cm. In this arrangement, approximately 20 solar cells 160, for example, are provided in a row along the X-axis direction.

The plurality of solar cells 160 are connected, for example, in series. As described in the first embodiment above, transparent electrodes are used in the solar cells. The resistivity of the material used for the transparent electrode is greater than that of metal or the like. The plurality of solar cells 160 are provided and connected in series in the solar cell module 210. It is thereby possible to suppress increases in the resistance of the transparent electrodes caused, for example, by increases in the area of the transparent electrodes. If transparent electrodes are used in the solar cells 160 of the solar cell module 210, approximately 10 to 15 solar cells 160 are typically connected in series on a substrate 5 from 10 to 20 cm in size.

The shape of the substrate 5 is not limited to a rectangle, but may be any shape. The shape and arrangement of the solar cells 160 is not limited to those described above. The shape and arrangement of the solar cells 160 may be set, as appropriate, according, for example, to the shape and the like of the substrate 5. The number of solar cells 160 may be any number commensurate, for example, with the size of the substrate 5. Some of the solar cells 160 may be connected in parallel. For example, if the module includes twenty solar cells 160, groups of 10 may be connected in series, and the groups then connected in parallel. The solar cell module 210 needs only include at least two solar cells 160 connected in series.

One of the solar cells 160 is a first solar cell 161. Another one of the solar cells 160 is a second solar cell 162. The second solar cell 162 is adjacent to the first solar cell 161.

The first solar cell 161 includes a first stacked body SB1. The first stacked body SB1 includes, for example, a first lower electrode 11, a first upper electrode 21, a first photoelectric conversion film 31, a first lower intermediate layer 41, and a first upper intermediate layer 51.

The second solar cell 162 includes a second stacked body SB2. The second stacked body SB2 includes, for example, a second lower electrode 12, a second upper electrode 22, a second photoelectric conversion film 32, a second lower intermediate layer 42, and a second upper intermediate layer 52.

In this example, the second upper electrode 22 extends over the conductive layer 60 of the first solar cell 161. The second upper electrode 22 contacts, for example, the conductive layer 60 of the first solar cell 161. The second upper electrode 22 is thereby electrically connected to the first lower electrode 11. Specifically, the second solar cell 162 is connected in series with the first solar cell 161.

In this example, the first solar cell 161 and second solar cell 162 are substantially identical to the solar cell 110 described in the first embodiment above. The first solar cell 161 and the second solar cell 162 may be considered as constituting, for example, an arrangement in which two solar cells 110 are disposed in a row and connected in series. The functions and materials of the various parts of the first solar cell 161 and the second solar cell 162 may be substantially identical to those of the solar cell 110 described in connection with the first embodiment. Therefore, detailed description thereof will be omitted.

The first stacked body SB1 includes a first region R1 in which foreign matter is present between the first lower electrode 11 and the first photoelectric conversion film 31, and a second region R2 in which foreign matter is not present between the first lower electrode 11 and the first photoelectric conversion film 31. The first stacked body SB1 also includes an insulating portion 64 provided above the foreign matter 66. In the first stacked body SB1, the insulating portion 64 increases the distance between the end 66s of the foreign matter 66 and the first upper electrode 21 over the distance between the first lower electrode 11 and the first upper electrode 21 in the second region R2.

It is thereby possible to suppress the generation of leakage current at the end 66s of the foreign matter 66 and improve the photoelectric conversion efficiency of the solar cell module 210.

In this example, the second stacked body SB2 includes a third region R3 in which foreign matter is present between the second lower electrode 12 and the second photoelectric conversion film 32, and a fourth region R4 in which foreign matter is not present between the second lower electrode 12 and the second photoelectric conversion film 32. The second stacked body SB2 also includes an insulating portion 64 provided above the foreign matter 66. In the second stacked body SB2, the insulating portion 64 increases the distance between the end 66s of the foreign matter 66 and the second upper electrode 22 over the distance between the second lower electrode 12 and the second upper electrode 22 in the fourth region R4.

It is thereby possible to more suitably suppress the generation of leakage current at the end 66s of the foreign matter 66 and further improve the photoelectric conversion efficiency of the solar cell module 210.

In this example, an instance has been described in which the first stacked body SB1 and the second stacked body SB2 each contain two locations of foreign matter 66. The number of locations of foreign matter 66 contained in the second stacked body SB2 is not necessarily the same as the number of locations of foreign matter 66 contained in the first stacked body SB1. For example, there may be no foreign matter 66 in the second stacked body SB2.

In the solar cell module 210, detection of foreign matter 66 is performed, for example, for each of the solar cells 160, and insulating portions 64 are formed for each of the solar cells 160 in which foreign matter 66 is detected. It is thereby possible to suitably suppress the generation of leakage current at the end 66s of the foreign matter 66 and improve photoelectric conversion efficiency.

The configuration of the plurality of solar cells 160 contained in the solar cell module 210 is not limited to the configuration of the solar cell 110; the configuration of any one of the various solar cells 111 to 113, 121 to 123, 131 to 135, 141 to 143, and 151 described in the first embodiment may be used.

Third Embodiment

Figure 15:
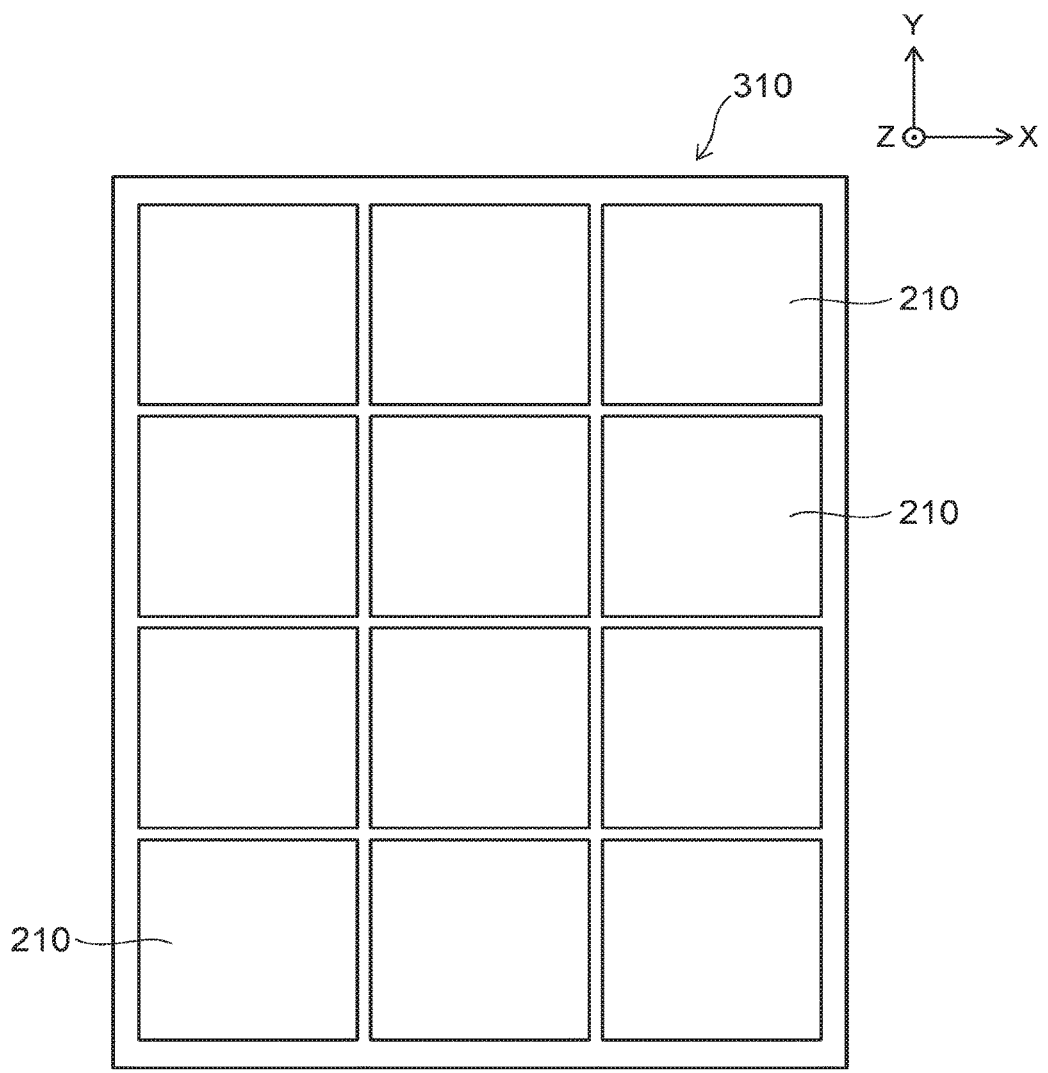
FIG. 15 is a schematic plan view of a photovoltaic generation panel according to a third embodiment.

FIG. 15 is a schematic plan view of a photovoltaic generation panel according to a third embodiment.

As illustrated in FIG. 15, a photovoltaic generation panel 310 includes a plurality of solar cell modules 210. In this example, the photovoltaic generation panel 310 includes a total of twelve solar cell modules 210 arranged in threes along the X-axis direction and in fours along the Y-axis direction. The length of one side of the solar cell modules 210 is approximately 30 cm. The size of the photovoltaic generation panel 310 is, for example, approximately 1 m×1.2 m. The plurality of solar cell modules 210 are connected in series or in parallel. The photovoltaic generation panel 310 thereby outputs a predetermined voltage and current. In this way, the solar cell module 210 may be used in a photovoltaic generation panel 310 in which a plurality of solar cell modules 210 are electrically connected. The number and arrangement of the solar cell modules 210 included in the photovoltaic generation panel 310 may be set as desired. According to the embodiments, a solar cell, a solar cell module, and a method for manufacturing solar cell each with high photoelectric conversion efficiency are provided.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, embodiments of the invention are described with reference to specific examples.

However, the embodiments of the invention are not limited to these specific examples. For example, one skilled in the art may similarly practice the invention by appropriately selecting specific configurations of components included in solar cells and solar cell modules such as substrates, lower electrodes, lower intermediate layers, photoelectric conversion films, upper electrodes, upper intermediate layers, first lower electrodes, first lower intermediate layers, first photoelectric conversion films, first upper electrodes, second lower electrodes, second lower intermediate layers, second photoelectric conversion films, second upper electrodes, conductive layers, insulating layers, insulating portions, stacked bodies, first stacked bodies, second stacked bodies, optical sensors, and drop dispenser units etc., from known art; and such practice is included in the scope of the invention to the extent that similar effects are obtained.

Further, any two or more components of the specific examples may be combined within the extent of technical feasibility and are included in the scope of the invention to the extent that the purport of the invention is included.

Moreover, all solar cells, solar cell modules, and methods for manufacturing solar cell practicable by an appropriate design modification by one skilled in the art based on the solar cells, solar cell modules, and methods for manufacturing solar cell described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A solar cell comprising:
   a substrate including a first upper surface; and
   a stacked body including:
      a lower electrode provided on the first upper surface, the lower electrode including a second upper surface including a first region and a second region, a direction from the first region toward the second region being along a first direction parallel with the first upper surface,
      a photoelectric conversion film provided on the first region and on the second region, wherein the second upper surface of the lower electrode faces the photoelectric conversion film,
      an upper electrode provided on the photoelectric conversion film, and
      a foreign matter disposed directly on the second upper surface of the lower electrode and located between the first region and the photoelectric conversion film, the foreign matter being not provided between the second region and the photoelectric conversion film,
      wherein a distance between a surface of the foreign matter facing the upper electrode and the upper electrode in a second direction is greater than a distance between the second region and the upper electrode in the second direction, the second direction being perpendicular to the first upper surface.

2. The solar cell according to claim 1, wherein the stacked body further includes an insulating portion provided between the foreign matter and the upper electrode.

3. The solar cell according to claim 1, wherein a length of the photoelectric conversion film in the second direction above the end of the surface of the foreign matter facing the upper electrode is greater than a length of the photoelectric conversion film in the second direction in the second region.

4. The solar cell according to claim 1, wherein the stacked body further includes a lower intermediate layer provided between the lower electrode and the photoelectric conversion film, and
   a length of the lower intermediate layer in the second direction above the surface of the foreign matter facing the upper electrode is greater than a length of the lower intermediate layer in the second direction in the second region.

5. The solar cell according to claim 1, wherein the stacked body further includes an upper intermediate layer provided between the photoelectric conversion film and the upper electrode, and
   a length of the upper intermediate layer in the second direction above the surface of the foreign matter facing the upper electrode is greater than a length of the upper intermediate layer in the second direction in the second region.

6. The solar cell according to claim 1, wherein the stacked body further includes a lower intermediate layer provided between the lower electrode and the photoelectric conversion film, and
   a thickness of the lower intermediate layer over an end of the lower electrode in the first direction is greater than a thickness of the lower intermediate layer in the second region.

7. The solar cell according to claim 1, wherein a thickness of the photoelectric conversion film over an end of the lower electrode in the first direction is greater than a thickness of the photoelectric conversion film in the second region.

8. The solar cell according to claim 1, wherein the stacked body further includes an upper intermediate layer provided between the photoelectric conversion film and the upper electrode, and
   a thickness of the upper intermediate layer over an end of the lower electrode in the first direction is greater than a thickness of the upper intermediate layer in the second region.

9. The solar cell according to claim 1, wherein the lower electrode includes a first portion and a second portion, a direction from the first portion toward the second portion being along the first direction,
   the photoelectric conversion film is provided on the first portion,
   the stacked body further includes a conductive layer, the conductive layer is provided between a part of the second upper surface and a part of the photoelectric conversion film and is electrically connected to the lower electrode, and
   the conductive layer has a conductivity higher than a conductivity of the lower electrode.

10. The solar cell according to claim 9, wherein the stacked body further includes an insulating layer provided over an end of the lower electrode in the first direction and an end of the conductive layer in the first direction.

11. The solar cell according to claim 9, wherein the stacked body further includes a lower intermediate layer provided between the lower electrode and the photoelectric conversion film, and a thickness of the lower intermediate layer over an end of the conductive layer in the first direction is greater than a thickness of the lower intermediate layer in the second region.

12. The solar cell according to claim 9, wherein a thickness of the photoelectric conversion film over an end of the conductive layer in the first direction is greater than a thickness of the photoelectric conversion film in the second region.

13. The solar cell according to claim 9, wherein the stacked body further includes an upper intermediate layer provided between the photoelectric conversion film and the upper electrode, and
a thickness of the upper intermediate layer over an end of the conductive layer in the first direction is greater than a thickness of the upper intermediate layer in the second region.

14. A solar cell module comprising:
a substrate including a first upper surface; and
a plurality of solar cells provided on the first upper surface;
one of the solar cells including a first stacked body that includes:
a first lower electrode provided on the first upper surface, the first lower electrode including a second upper surface including a first region and a second region, a direction from the first region toward the second region being along a first direction parallel with the first upper surface,
a first photoelectric conversion film provided on the first region and on the second region, wherein the second upper surface of the first lower electrode faces the first photoelectric conversion film, and
a first upper electrode provided on the first photoelectric conversion film,
one other of the solar cells adjacent to the one of the solar cells including a second stacked body that includes:
a second lower electrode provided on the first upper surface,
a second photoelectric conversion film provided on the second lower electrode, and
a second upper electrode provided on the second photoelectric conversion film,
wherein the first stacked body includes a foreign matter disposed directly on the second upper surface of the first lower electrode and located between the first region and the first photoelectric conversion film, the foreign matter being not provided between the second region and the first photoelectric conversion film, and
wherein a distance between a surface of the foreign matter facing the first upper electrode and the first upper electrode in a second direction is greater than a distance between the second region and the first upper electrode in the second direction, the second direction being perpendicular to the first upper surface.

15. The solar cell according to claim 1, wherein the foreign matter directly contacts the second upper surface.

16. The solar cell according to claim 2, wherein the foreign matter directly contacts the second upper surface.

* * * * *